(12) United States Patent
Port et al.

(10) Patent No.: US 11,616,482 B2
(45) Date of Patent: Mar. 28, 2023

(54) MULTICHANNEL AUDIO ENHANCEMENT, DECODING, AND RENDERING IN RESPONSE TO FEEDBACK

(71) Applicant: Dolby Laboratories Licensing Corporation, San Francisco, CA (US)

(72) Inventors: Timothy Alan Port, Drummoyne (AU); Sean Alexander Brady, Glebe (AU)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 118 days.

(21) Appl. No.: 17/255,350

(22) PCT Filed: Jun. 20, 2019

(86) PCT No.: PCT/US2019/038333
§ 371 (c)(1),
(2) Date: Dec. 22, 2020

(87) PCT Pub. No.: WO2019/246457
PCT Pub. Date: Dec. 26, 2019

(65) Prior Publication Data
US 2021/0265966 A1    Aug. 26, 2021

Related U.S. Application Data

(60) Provisional application No. 62/827,004, filed on Mar. 30, 2019, provisional application No. 62/688,625, filed on Jun. 22, 2018.

(51) Int. Cl.
| | |
|---|---|
| *H03G 9/02* | (2006.01) |
| *H03G 3/30* | (2006.01) |
| *H03G 9/00* | (2006.01) |
| *H04R 3/04* | (2006.01) |

(52) U.S. Cl.
CPC .......... *H03G 9/025* (2013.01); *H03G 3/3005* (2013.01); *H03G 9/005* (2013.01); *H04R 3/04* (2013.01); *H04R 2430/03* (2013.01)

(58) Field of Classification Search
CPC ...... H03G 9/025; H03G 3/3005; H03G 9/005; H03G 5/005; H03G 5/16; H04R 3/04;
(Continued)

(56) References Cited

U.S. PATENT DOCUMENTS

| | | |
|---|---|---|
| 4,641,361 A | 2/1987 | Rosback |
| 5,278,912 A | 1/1994 | Waldhauer |

(Continued)

FOREIGN PATENT DOCUMENTS

| | | |
|---|---|---|
| WO | 2017079334 | 5/2017 |
| WO | 2018059736 A1 | 4/2018 |
| WO | 2019246449 | 12/2019 |

*Primary Examiner* — Xu Mei

(57) ABSTRACT

In some embodiments, a method for performing at least one of enhancement, decoding, or rendering of a multichannel audio signal in response to compression feedback or feedback from a smart amplifier. For example, the compression feedback may be indicative of amount of compression applied to each of multiple frequency bands, of the audio signal or an enhanced audio signal generated in response thereto. The enhancement (e.g., bass enhancement) may include dynamic routing of audio content of the input audio signal between channels of an enhanced audio signal generated in response thereto. The enhancement and compression may be performed on a per speaker class basis. Other aspects are systems (e.g., programmed processors) and devices (e.g., devices having physically-limited bass reproduction capabilities, such as, for example, a notebook or laptop computer, tablet, soundbar, mobile phone, or other device with small speakers) configured to perform any embodiment of the method.

7 Claims, 6 Drawing Sheets

(58) Field of Classification Search
CPC ............ H04R 2430/03; H04R 2430/01; H04R 3/007; H04S 7/30
USPC .............. 381/1, 17–23, 98, 99, 106; 333/14; 455/72
See application file for complete search history.

(56) References Cited

U.S. PATENT DOCUMENTS

| | | |
|---|---|---|
| 7,317,800 B1 | 1/2008 | Matthias |
| 8,412,343 B2 | 4/2013 | Schleich |
| 8,861,760 B2 | 10/2014 | Strelcyk |
| 8,867,750 B2 | 10/2014 | Brown |
| 9,196,258 B2 | 11/2015 | Leblanc |
| 9,225,309 B2 | 12/2015 | Taffner |
| 9,344,825 B2 | 5/2016 | Carroll |
| 9,385,674 B2 | 7/2016 | Doy |
| 9,729,969 B2 * | 8/2017 | Risberg ................ H03G 11/008 |
| 9,860,644 B1 | 1/2018 | Ramos |
| 9,960,744 B1 | 5/2018 | Lee |
| 10,382,857 B1 * | 8/2019 | Khanal .................... H04R 3/04 |
| 11,102,577 B2 * | 8/2021 | Neoran .................... H04R 5/04 |
| 2005/0013446 A1 * | 1/2005 | Aarts ........................ H04S 1/00 381/98 |
| 2011/0280407 A1 | 11/2011 | Skinner |
| 2013/0163784 A1 | 6/2013 | Themis |
| 2015/0010168 A1 | 1/2015 | Cheng |
| 2015/0350783 A1 * | 12/2015 | Krishnaswamy ...... H04R 3/007 381/55 |
| 2018/0014121 A1 | 1/2018 | Lawrence |
| 2018/0115824 A1 | 4/2018 | Cassidy |

* cited by examiner

MULTICHANNEL AUDIO ENHANCEMENT, DECODING, AND RENDERING IN RESPONSE TO FEEDBACK

CROSS-REFERENCE TO RELATED APPLICATION(S)

This application claims the benefit of priority to U.S. Provisional Patent Application No. 62/827,004, filed Mar. 30, 2019, and U.S. Provisional Patent Application No. 62/688,625, filed Jun. 22, 2018, both of which are hereby incorporated by reference in their entirety.

TECHNICAL FIELD

The invention pertains to methods and systems for performing enhancement (e.g., bass enhancement) and compression on a multichannel audio signal to generate an enhanced audio signal, and/or decoding and/or rendering on a multichannel audio signal, in response to feedback (e.g., compression feedback indicative of compression applied to each of at least two frequency bands of the enhanced audio signal).

BACKGROUND OF THE INVENTION

Speakers have a limited linear region. Many commercially available audio processing products employ a broadband limiter to ensure that speakers of (or driven by) the product do not distort. Distortion however is a frequency dependent behavior. To remedy this, a multiband limiter can be employed. In response to an increase in playback level in a product employing a multiband limiter, some frequency bands can be unaffected. This can result in a louder sound but also a spectral imbalance in the sound at higher volumes. In some commercially available products, a hybrid approach (known as timbre preservation) is employed that limits the audio in a wider band way to ensure the timbre is preserved.

However, conventional approaches to limiting typically do not consider the previous processing within the audio signal processing chain and therefore can undo effects that were intentionally applied. Referenced U.S. Provisional Patent Application 62/688,625 describes methods and systems which address this problem (and other problems and limitations of conventional systems) by performing enhancement processing in response to compression feedback from a limiter, which can effectively prevent the limiting from undoing effects intentionally applied to the audio.

There are several known methods for modifying an audio signal (thereby generating an enhanced audio signal) to enhance the low frequency (bass) content perceived during playback of the enhanced audio signal. These can be categorized as:

"equalization-type bass enhancement" technologies which enhance the real (physical) bass response of a speaker employed for playback by boosting low frequency content via equalization strategies, or "psychoacoustic bass enhancement" technologies which enhance the perceived bass response of a speaker (e.g., a small loudspeaker) employed for playback via psychoacoustic strategies (e.g., "virtual bass" synthesis or generation methods) designed to increase the perceived level of bass content of an audio signal during playback by at least one loudspeaker that cannot physically reproduce bass frequencies of the audio signal.

Equalization strategies are simpler to implement and are generally deemed to provide a better listening experience than psychoacoustic strategies. Thus, if a speaker (to be employed for playback of an audio signal) is capable of reproducing real/physical low frequency content, equalization-type bass enhancement is typically applied to the signal rather than psychoacoustic bass enhancement. In some cases (e.g., when a speaker to be employed for playback is not capable of reproducing real/physical low frequency content), psychoacoustic bass enhancement is employed to replace or supplement equalization-type bass enhancement.

At volume levels (of an input audio signal to undergo enhancement and playback) which are significantly below a speaker's maximum operating level, equalization-type bass enhancement strategies typically work well. However, at higher volume levels, boosting real/physical low frequency content by equalization-type bass enhancement may cause a speaker to distort at these low frequencies.

It is known to guard against speaker distortion by using a multiband compressor (e.g., the Audio Regulator of the Dolby Audio API) which attenuates individual frequency bands of an audio signal according to band energy thresholds which may be configured based on a playback system's real-world distortion characteristics for energy in individual bands. A multiband compressor (sometimes referred to herein as a "regulator" or "multiband limiter") may limit or attenuate, but does not boost, signal level in any frequency band of the audio signal on which it operates.

However, equalization-type bass enhancement to boost low frequency content may be counteracted (especially when playback at high volumes is intended) by multiband compression (implemented by a regulator) to reduce speaker distortion, sometimes to the point of complete cancellation of the bass enhancement. Application of both such bass enhancement and compression may even have the unintended consequence of reducing overall playback volume, since the regulator may also attempt to preserve timbre (e.g., by not only attenuating at least one band to prevent distortion but also attempting to attenuate neighboring bands by a similar amount).

Psychoacoustic strategies for bass enhancement (e.g., those implemented by "Virtual Bass" processing of the Dolby Audio API) supplement energy from lower frequency bands (which the playback speaker is unable to reproduce) with energy in higher frequency bands which the speaker is able to reproduce. Typically this type of bass enhancement processing is used when a speaker is not capable of reproducing low frequency content at any volume level, due to fundamental physical limitations of the speaker. However, it could also be used (as it is in some embodiments of the present invention) when it is possible but not desirable (e.g., due to a more nuanced system limitation) for a speaker to reproduce the relevant low frequency content.

One conventional type of psychoacoustic bass enhancement is bass synthesis, which is a collective name for a class of techniques that add in components to the low frequency range of an audio signal in order to enhance the bass that is perceived during playback of the enhanced signal. Some such techniques (sometimes referred to as sub bass synthesis methods) create low frequency components below the signal's existing frequency components in order to extend and improve the lowest frequency range. Other techniques in the class, known as "virtual pitch" algorithms, generate audible harmonics from an inaudible bass range (e.g., a bass range that is inaudible when the signal is rendered by small loudspeakers), so that the generated harmonics improve the perceived bass response. Virtual pitch methods typically exploit the well-known "missing fundamental" phenomenon, in which low pitches (one or more low frequency fundamentals, and lower harmonics of each fundamental) can sometimes be inferred by a human auditory system from upper harmonics of the low frequency fundamental(s), when the fundamental(s) and lower harmonics (e.g., the first harmonic of each fundamental) themselves are missing.

BRIEF DESCRIPTION OF THE INVENTION

In a first class of embodiments, the invention is a method for audio signal compression and enhancement, including steps of: performing enhancement on a multichannel audio signal to generate an enhanced audio signal; and performing multiband compression on the enhanced audio signal, thereby generating a compressed, enhanced audio signal, wherein the enhancement is performed in response to at least one of feedback from a smart amplifier or compression feedback. The compression feedback is indicative of at least one of: amount of compression applied or to be (e.g., predicted to be) applied to each of at least one frequency band (e.g., each of at least two frequency bands) of (e.g., of at least one channel of) the enhanced audio signal, or power or amplitude of at least one channel of the enhanced audio signal, or state of a system volume control. For example, the compression feedback may be indicative of amount and/or type of distortion (e.g., harmonic and/or intermodulation distortion) predicted for relevant driver(s) or to be prevented by the multiband compression. The feedback from the smart amplifier may be indicative of at least one of temperature, voltage, current, impedance (e.g., capacitance or inductance), or resistance, of at least one speaker (e.g., at least one coil of at least one speaker). The enhancement may include dynamic routing of audio content of the audio signal between channels of the enhanced audio signal. The dynamic routing may be frequency dependent.

In some embodiments, the method implements enhancement and compression of multichannel audio using at least one multichannel approach that considers the power handling characteristics of speakers, for example speakers (of a speaker system) that are homogenous in their type and/or speakers that are heterogeneous in their types. For example, the compression may be applied by two or more multiband limiters (or two or more multiband limiters and/or smart amplifiers), each coupled and configured to generate compressed audio for playback by a different subset of a set of speakers (e.g., where each subset consists of speaker(s), of a speaker subsystem, of a different type or class), and the enhancement may include dynamic routing of audio content of the audio signal between channels (of the enhanced audio signal) to be compressed (e.g., by different ones of the limiters, or by different ones of the limiters and/or at least one smart amplifier). Typical embodiments are readily implemented in consumer devices (e.g., soundbars and televisions, and importantly, in multichannel laptop computers and multichannel phones). A main goal of typical embodiments is to improve the volume and/or intelligibility of the system, although this may be at the expense of spatial fidelity in some embodiments.

In typical embodiments, the enhancement is or includes bass enhancement. Examples of types of enhancement performed in some embodiments include (but are not limited to): bass volume enhancement (e.g., including routing of audio content between different channels to undergo compression), virtual bass enhancement, filtering and routing of audio content (on a per speaker class basis) according to speaker handling characteristics at the time of playback, dialog enhancement, and virtualization.

Some embodiments include steps of: enhancing the multichannel audio signal (e.g., in an enhancement stage or subsystem) to generate the enhanced audio signal; and performing multiband compression (e.g., in a regulator coupled to an output of the enhancement stage or subsystem) on the enhanced audio signal (e.g., in an effort to prevent distortion upon playback), where the enhancement is performed in response to the compression feedback and/or feedback from the smart amplifier.

In another class of embodiments, the invention is a method for audio signal compression and rendering, including steps of: performing multiband compression on a multichannel audio signal, thereby generating a compressed audio signal; and rendering the compressed audio signal in response to at least one of feedback from a smart amplifier or compression feedback. The compression feedback is indicative of at least one of: amount of compression applied or to be (e.g., predicted to be) applied to each of at least one frequency band (e.g., each of at least two frequency bands) of the multichannel audio signal, or power or amplitude of at least one channel of the multichannel audio signal, or state of a system volume control. The multichannel audio signal may include speaker channels, or object channels, or both speaker channels and object channels. The multichannel audio signal may be an enhanced multichannel audio signal, and the method may also include a step of performing (e.g., in response to at least some of the feedback) enhancement on a multichannel audio signal to generate the enhanced multichannel audio signal.

In other embodiments, the invention is a method for rendering and/or decoding an audio signal (e.g., a multichannel audio signal) in response to at least one of compression feedback (e.g., from a multiband limiter) or feedback from a smart amplifier. The rendering (and/or decoding) may be performed differently in response to different feedback. For example, at least one channel (e.g., each object channel) of the audio signal may be ignored (i.e., not decoded or not rendered) in response to feedback indicating that a multiband limiter is limiting at least one band (e.g., each of at least two bands) of audio content of at least one channel of the signal.

Another aspect of the invention is a system (e.g., a device having physically-limited or otherwise limited bass reproduction capabilities, such as, for example, a laptop or notebook computer, tablet, soundbar, mobile phone, or other device with small speakers) configured to perform any embodiment of the inventive method on an input audio signal.

In a class of embodiments, the invention is an audio playback system (e.g., a notebook, laptop, tablet, soundbar, mobile phone, or other device with (or for use with) small speakers, or a playback system which has limited (e.g., physically-limited) bass reproduction capabilities), and is configured to perform audio enhancement (e.g., bass enhancement) on audio in response to compression feedback or feedback from a smart amplifier (in accordance with any embodiment of the inventive method) to generate enhanced audio, and to playback the enhanced audio.

In some embodiments, the inventive system is a decoder (e.g., configured to perform audio enhancement in connection with decoding) or an audio rendering system, configured to perform an embodiment of the inventive method.

In some embodiments, the inventive system is or includes a general or special purpose processor programmed with software (or firmware) and/or otherwise configured to perform an embodiment of the inventive method. In some embodiments, the inventive system is a general purpose processor, coupled to receive input audio data, and programmed (with appropriate software) to generate output audio data by performing an embodiment of the inventive method. In some embodiments, the inventive system is a digital signal processor, coupled to receive input audio data, and configured (e.g., programmed) to generate output audio data in response to the input audio data by performing an embodiment of the inventive method.

Aspects of the invention include a system configured (e.g., programmed) to perform any embodiment of the inventive method, and a computer readable medium (e.g., a disc) which stores code for implementing any embodiment of the inventive method.

NOTATION AND NOMENCLATURE

Figure 1:
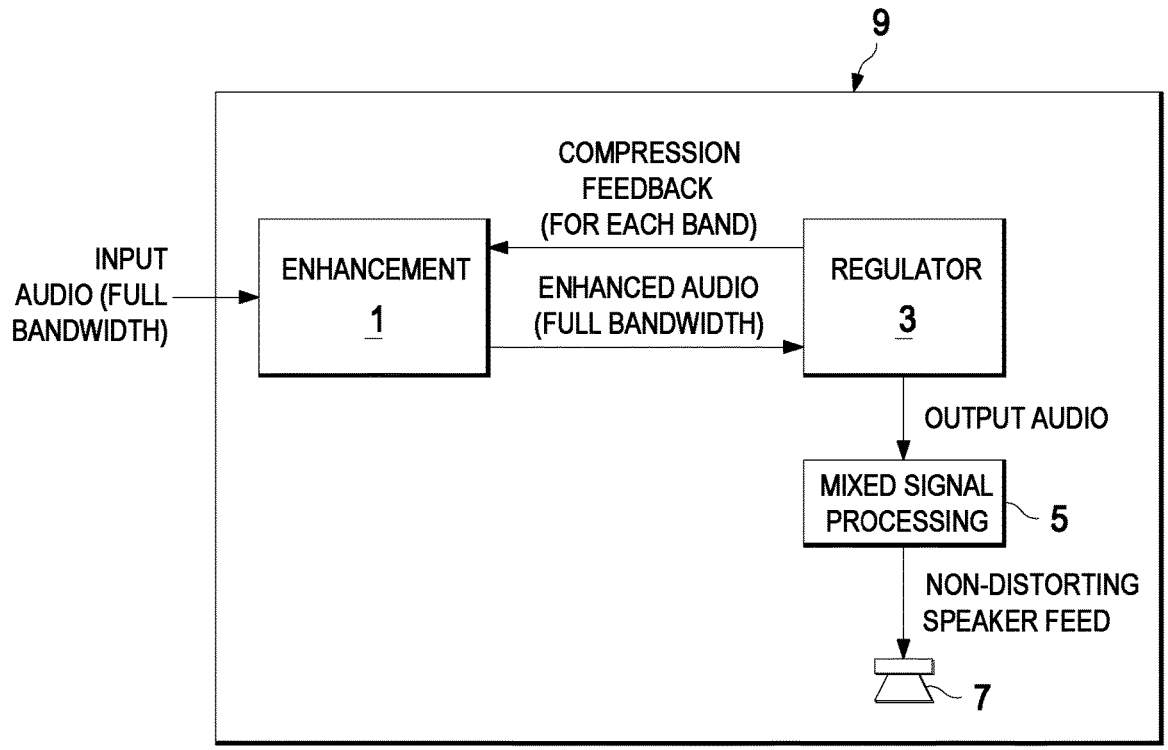
FIG. 1 is a block diagram of a system configured to perform audio enhancement (e.g., bass enhancement).

Throughout this disclosure, including in the claims, the expressions "band" and "frequency hand" are used interchangeably, as synonyms.

Throughout this disclosure, including in the claims:

the term channel (or "audio channel") denotes a monophonic audio signal. Such a signal can typically be rendered in such a way as to be equivalent to application of the signal directly to a loudspeaker at a desired or nominal position. The desired position can be static, as is typically the case with physical loudspeakers, or dynamic;

"speaker channel" denotes an audio channel that is associated with a named loudspeaker (at a desired or nominal position), or with a named speaker zone within a defined speaker configuration. A speaker channel is rendered in such a way as to be equivalent to application of the audio signal directly to the named loudspeaker (at the desired or nominal position) or to a speaker in the named speaker zone;

"object" (or "audio object" or "object channel") denotes an audio channel indicative of sound emitted by an audio source (sometimes also referred to as an audio "object"). Typically, an object channel determines a parametric audio source description (e.g., metadata indicative of the parametric audio source description is included in or provided with the object channel). The source description may determine sound emitted by the source (as a function of time), the apparent position (e.g., 3D spatial coordinates) of the source as a function of time, and optionally at least one additional parameter (e.g., apparent source size or width) characterizing the source;

"channel" of a multichannel audio signal denotes either a speaker channel or an audio object (or the audio content, excluding related metadata, of an audio object);

"object-based audio" denotes audio (e.g., an audio signal or audio program) comprising a set of one or more object channels (and optionally also comprising at least one speaker channel) and optionally also associated metadata (e.g., metadata indicative of a trajectory of an audio object which emits sound indicated by an object channel, or metadata otherwise indicative of a desired spatial audio presentation of sound indicated by an object channel, or metadata indicative of an identification of at least one audio object which is a source of sound indicated by an object channel); and "render" denotes the process of converting audio (e.g., an audio program) into one or more speaker feeds, or the process of converting audio (e.g., an audio program) into one or more speaker feeds and converting the speaker feed(s) to sound using one or more loudspeakers (in the latter case, the rendering is sometimes referred to herein as rendering "by" the loudspeaker(s)).

Throughout this disclosure, including in the claims, the expression "multiband compression" of or on an audio signal (e.g., on frequency domain data indicative of an enhanced audio signal or other audio signal, or on one or more channels of a multi-channel audio signal) denotes limiting compression on a band-by-band basis (in at least two different frequency bands) which does not increase level of the signal in any frequency band. In each band, multiband compression either reduces (or does not change, or does not change by a substantial or significant amount) level of the signal. Multiband compression is sometimes referred to herein as "regulation," and a compressor which performs or is configured to perform multiband compression is sometimes referred to herein as a "regulator."

Throughout this disclosure, including in the claims, the expression "enhancement" (or "audio enhancement") of or on an audio signal (e.g., on frequency domain data indicative of an audio signal, or one or more channels of a multichannel audio signal) denotes any enhancing operation performed on the signal. For example, enhancement may be an enhancing operation performed on a band-by-band basis (in at least two different frequency bands of the signal) on the signal. Examples of audio enhancement include, but are not limited to, bass enhancement (e.g., equalization-type bass enhancement or psychoacoustic bass enhancement), dialog enhancement, upmixing, frequency shifting, harmonic injection or transposition, subharmonic injection, virtualization, and equalization.

Throughout this disclosure, including in the claims, the expression performing an operation "on" a signal or data (e.g., filtering, scaling, transforming, or applying gain to, the signal or data) is used in a broad sense to denote performing the operation directly on the signal or data, or on a processed version of the signal or data (e.g., on a version of the signal that has undergone preliminary filtering or pre-processing prior to performance of the operation thereon).

Throughout this disclosure including in the claims, the expression "system" is used in a broad sense to denote a device, system, or subsystem. For example, a subsystem that implements a decoder may be referred to as a decoder system, and a system including such a subsystem (e.g., a system that generates X output signals in response to multiple inputs, in which the subsystem generates M of the inputs and the other X−M inputs are received from an external source) may also be referred to as a decoder system.

Throughout this disclosure including in the claims, the term "processor" is used in a broad sense to denote a system or device programmable or otherwise configurable (e.g., with software or firmware) to perform operations on data (e.g., audio, or video or other image data). Examples of processors include a field-programmable gate array (or other configurable integrated circuit or chip set), a digital signal processor programmed and/or otherwise configured to perform pipelined processing on audio or other sound data, a programmable general purpose processor or computer, and a programmable microprocessor chip or chip set.

Throughout this disclosure including in the claims, the term "couples" or "coupled" is used to mean either a direct or indirect connection. Thus, if a first device couples to a second device, that connection may be through a direct connection, or through an indirect connection via other devices and connections.

DETAILED DESCRIPTION OF THE
PREFERRED EMBODIMENTS

Many embodiments of the present invention are technologically possible. It will be apparent to those of ordinary skill in the art from the present disclosure how to implement them. Embodiments of the inventive system, method, and medium will be described with reference to FIGS. 3, 3A, and 4-11.

FIG. 1 is a block diagram of a system (9) configured to perform audio enhancement. In the FIG. 1 system, enhancement subsystem 1 is coupled and configured to perform audio enhancement on an input audio signal, thereby generating an enhanced audio signal. Regulator 3 (sometimes referred to as multiband compression subsystem 3) is coupled to enhancement subsystem 1 and configured to perform multiband compression on the enhanced audio signal, thereby generating an output audio signal which is a compressed, enhanced audio signal. In operation, subsystem 3 applies compression on a band-by-band basis to the enhanced audio signal (i.e., to reduce or leave unchanged the level of each frequency band, at each time of a sequence of times, of the enhanced audio signal) in a manner intended to prevent distortion upon playback of the compressed, enhanced audio signal output from subsystem 3. Subsystem 3 is also configured to generate a compression signal indicative of the amount of compression (level attenuation) applied by subsystem 3 to each of at least one frequency band (e.g., to each of at least two individual frequency bands, or to each of the entire set of individual frequency bands) of the enhanced audio signal, and this compression signal is provided as a feedback to enhancement subsystem 1. The compression signal is thus a feedback signal indicative of amount of compression applied by regulator subsystem 3 to at least one frequency band (or each of at least two frequency bands) of the enhanced audio signal.

Enhancement subsystem 1 is configured to perform audio enhancement in response to the compression signal (a feedback signal indicative of amount of compression applied to at least one frequency band (e.g., each of at least two individual frequency bands) of the enhanced audio signal.

The FIG. 1 system also includes mixed signal processing subsystem 5 (coupled to regulator 3) and speaker 7 (coupled to subsystem 5). In operation, the compressed, enhanced audio signal output from regulator 3 is provided to subsystem 5, and subsystem 5 (with speaker 7) perform playback of audio content of the compressed, enhanced audio signal. Subsystem 5 is configured to generate a speaker feed in response to the compressed, enhanced audio signal. The speaker feed is provided to speaker 7, and speaker 7 is configured to emit sound in response to the speaker feed. Typically, the compression performed by regulator 3 prevents the sound from being distorted.

Thus, subsystem 5 is configured to render audio content (indicated by the compressed, enhanced audio signal) by converting the content into the speaker feed of the compressed, enhanced audio signal (and thus subsystem 5 may be referred to as a rendering subsystem), and subsystem 5 (together with speaker 7) is configured to render such audio content by converting the content into the speaker feed and converting the speaker feed to sound.

Figure 2:
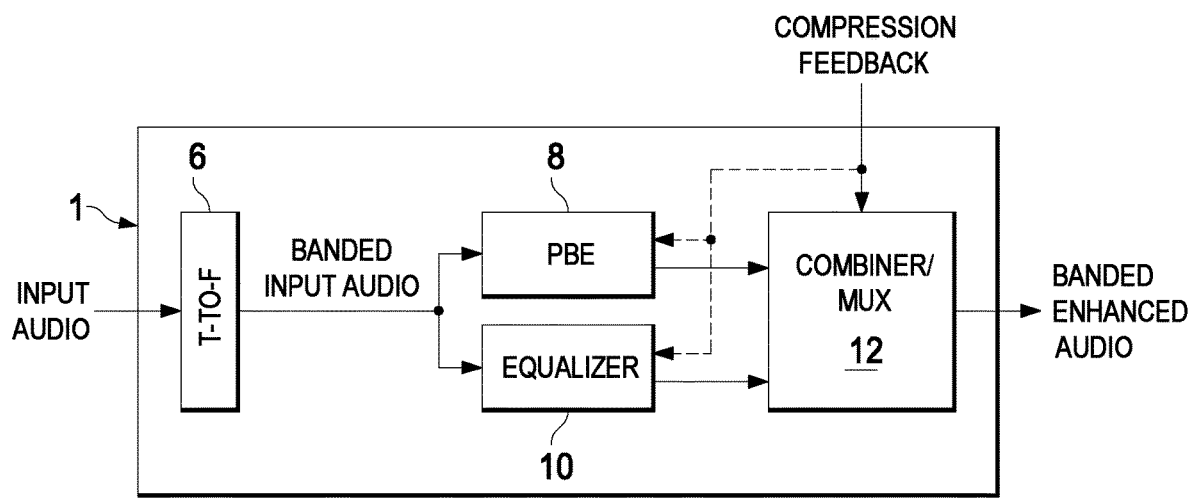
FIG. 2 is a block diagram of an embodiment of enhancement subsystem 1 of the FIG. 1 system.

In some embodiments, enhancement subsystem 1 of FIG. 1 is configured to perform one or both of psychoacoustic bass enhancement (e.g., harmonic transposition) and equalization-type bass enhancement to generate a bass enhanced audio signal in response to the input audio signal, and the bass enhancement is performed in response to feedback indicative of amount of compression applied by a regulator (e.g., regulator 3) to each of at least two frequency bands of the bass enhanced audio signal (e.g., to selectively apply one or the other, or both, of the two types of bass enhancement to the input audio signal) in a manner controlled by the feedback. FIG. 2 is a block diagram of an example of such an embodiment of enhancement subsystem 1 of the FIG. 1 system.

In FIG. 2, transform element 6 is configured to perform a time domain-to-frequency domain transform (e.g., FFT) on an input audio signal to generate banded input audio indicative of the audio content of the input audio signal, such that the banded input audio includes a sequence of frequency components for each different frequency band of a set of frequency bands. Thus, in the FIG. 2 embodiment (as in some embodiments of the invention) the input data to be enhanced are banded frequency domain audio data indicative of the audio content of the input audio signal. Psychoacoustic bass enhancement ("PBE") subsystem 8 is coupled and configured to perform psychoacoustic bass enhancement on the banded input audio (typically, including by boosting (increasing the level of) content in frequency bands other than the lowest frequency bands). Equalization-type bass enhancement subsystem ("equalizer") 10 is coupled and configured to perform equalization-type bass enhancement on the banded input audio (typically, to boost content in low frequency bands). Combination subsystem 12 is coupled to receive the audio output of each of subsystems 8 and 10, and the compression feedback signal ("compression feedback") generated by regulator 3 of FIG. 1, and is configured to generate, in response thereto, banded enhanced audio. The banded enhanced audio is the output of the FIG. 2 embodiment of enhancement subsystem 1 and is provided to regulator 3 of FIG. 1. The compression feedback is indicative of amount of compression applied by regulator 3 to each of at least two frequency bands of the banded enhanced audio. Typically, the frequency bands of the banded enhanced audio (output from combination subsystem 12) are the same as those to which regulator 3 applies compression (and the same as those of the banded audio which is output from transform in subsystem 6), and the compression feedback is indicative of amount of compression applied by regulator 3 to each of these bands.

Combination subsystem 12 is configured to combine the outputs of subsystems 8 and 10 to generate the banded enhanced audio to be (at any time): the output of one or the other of subsystems 8 and 10 for the time; or a combination (e.g., linear combination) of frequency components output from subsystems 8 and 10 for the time.

In other embodiments (not shown in FIG. 2), subsystems 8 and 10 are coupled in series, and subsystem 12 is omitted.

Combination subsystem 12 is typically configured to generate the banded enhanced audio as a sequence of banded enhanced audio values, with the banded enhanced audio values corresponding to each time (or time interval) consisting of values for each of a number of different frequency bands, and such that each of the values for one time (or time interval) and one band is:

a combination (e.g., linear combination) of frequency components output from subsystems 8 and 10 for the time (or time interval) and band (e.g., in response to some values of the compression feedback for the corresponding time or interval), or a frequency component output from one or the other of subsystems 8 and 10 for the time (or time interval) and band (e.g., in response to some other values of the compression feedback for the corresponding time or interval).

For example, when the compression feedback indicates that regulator 3 is not applying compression in any band, the output of subsystem 12 for each band (at the corresponding time or time interval) may be a frequency component output from subsystem 10. If the compression feedback (corresponding to a later time or time interval) then indicates that regulator 3 is applying compression in each band (to prevent distortion), the output of subsystem 12 for each band (at the corresponding time or interval) may be a frequency component output from subsystem 8.

For another example, when the compression feedback indicates that regulator 3 is not applying compression (or is applying a small amount of attenuation) in a band, the output of subsystem 12 for the band (at the corresponding time or time interval) may be a first linear combination of a frequency component output from subsystem 8 and a frequency component output from subsystem 10 (e.g., aX+bY, where a and h are factors, X is the frequency component output from subsystem 8, and Y is the frequency component output from subsystem 10). If the compression feedback (corresponding to a later time or time interval) then indicates that regulator 3 is applying compression (or is applying a greater amount of attenuation) in the band, the output of subsystem 12 for each band (at the corresponding time or interval) may be a second linear combination (different than the first linear combination) of a frequency component output from subsystem 8 and a frequency component output from subsystem 10 (e.g., cX+dY, where c is a factor different than a, d is a factor different than b, X is the frequency component output from subsystem 8, and Y is the frequency component output from subsystem 10).

Alternatively (or additionally), the compression feedback is provided to subsystem 8 and/or subsystem 10 (as indicated by dashed lines in FIG. 2) to control the manner in which subsystem 8 and/or subsystem 10 performs bass enhancement. For example, operation of one or both of subsystems 8 and 10 may be enabled or disabled (during a time interval) in response to the compression feedback, and/or the manner in which one or both of subsystems 8 and 10 performs enhancement on the banded input audio may be controlled by the compression feedback.

For example, PBE subsystem 8 may perform harmonic transposition using even harmonics in response to some values of the compression feedback, and/or using odd harmonics in response to some other values of the compression feedback. In typical operation of the FIG. 2 system, bass enhancement by subsystem 8 and/or subsystem 10 is controlled (by the compression feedback) so as to prevent the bass enhancement from causing distortion (upon playback) in any specific band (given the amount of compression being applied by regulator 3 in that band), and/or to prevent regulator 3 from applying compression in one or more specific bands. Less (or a different type of) processing by subsystem 8 (or subsystem 10) in a band may be desired in the case that regulator 3 is applying a lot of attenuation in the band, to prevent distortion.

For example, a boost (applied by subsystem 10) in a band may be reduced in the case that the feedback indicates that regulator 3 applies a lot of attenuation (e.g., attenuation in excess of a predetermined threshold amount) in the band, e.g., in cases in which too much boosting (by subsystem 10) with high compression (by regulator 3) could result in distortion. In some embodiments, an amount or degree of processing by one of subsystems 8 or 10 is determined in response to the amount or degree of processing by the other one of subsystems 8 or 10 (which is in turn determined by the compression feedback), e.g., to keep a total amount or degree of processing by both subsystems 8 and 10 constant or at a desired amount.

In typical implementations of system 9 of FIG. 1, a full bandwidth compression feedback signal (indicative of compression applied by regulator 3 in each band of a full set of bands) is fed into enhancement subsystem 1 (sometimes referred to as an enhancement layer). In response, enhancement subsystem 1 produces an enhanced audio signal that is fed into regulator 3, and regulator 3 and subsystem 5 operate to produce a non-distorted speaker feed. The compression feedback signal may have some gating to ensure there is no undesirable pumping of the signal output from regulator 3.

Typical reasons for a change in the amount of limiting (attenuation) applied by regulator 3 (in at least one band) include a change in playback volume due to a user control or a change in level of an audio signal provided to or generated by the system. It is fundamentally important that the regulator be placed in series after the enhancement layer (in the sense that the regulator operates on the output of the enhancement layer) to ensure that the speaker is not fed with a signal that would cause it to distort.

Figure 3:
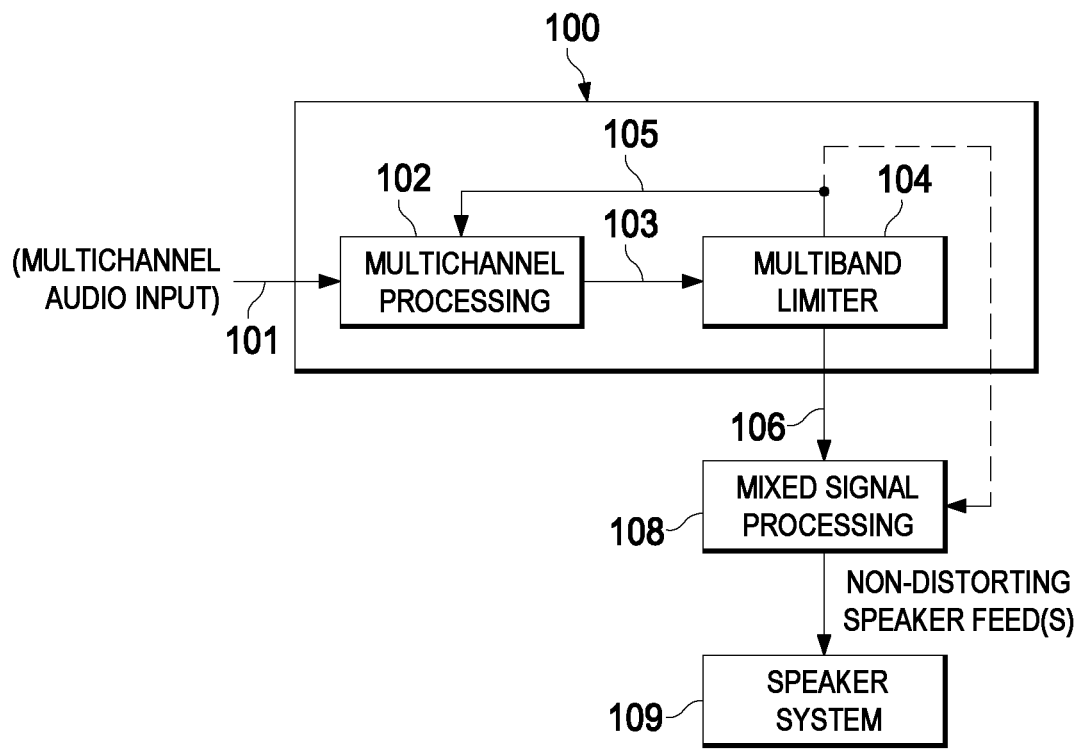
FIG. 3 is a block diagram of a system configured to perform audio enhancement (e.g., bass enhancement) and compression in accordance with an embodiment of the invention, and rendering of the resulting compressed, enhanced audio (optionally also in accordance with an embodiment of the invention).

With reference to FIG. 3, a first class of embodiments (e.g., system 100, and a system comprising elements 100, 108, and 109 of FIG. 3) of the inventive method and system will be described. System 100 includes multichannel processing subsystem 102 which is coupled and configured to generate audio signal 103 (which includes one or more channels, and which will sometimes be referred to herein as "enhanced audio signal" 103) in response to multichannel audio input signal 101 (which includes at least two channels). Typically, the channels of signal 101 (and signal 103) are speaker channels. In some other embodiments (e.g., as described with reference to FIG. 3A, and elsewhere herein) the channels of the audio input signal are object channels or include at least one object channel and at least one speaker channel. When signal 101 includes at least one speaker channel, the number of speaker channels of signal 101 may equal the number of speaker channels of signal 103 (and the number of speaker feeds output from subsystem 108), or the number of speaker channels of signal 101 may be less than (e.g., when upmixing is implemented) or greater than the number of speaker channels of signal 103 (and/or the number of speaker feeds output from subsystem 108). Signal 101 may be the output of a decoder (e.g., as is the output of decoder 802 of FIG. 3A). In some cases, system 100 (e.g., subsystem 102 thereof) may perform decoding (or at least one step of decoding) on signal 101.

System 100 also includes multiband limiter 104 which is coupled to subsystem 102 and configured to perform compression on frequency bands of at least one (and typically each) channel of enhanced audio signal 103, to generate compressed, enhanced audio output signal 106. Multiband limiter 104 is also configured to generate compression feedback signal 105 which is typically indicative of an amount of compression applied by limiter 104 in each of at least one frequency band (e.g., each of at least two frequency bands) of each of at least one channel of signal 103. Subsystem 102 is coupled and configured to receive compression feedback 105 from limiter 104, and to perform multichannel enhancement or other multichannel audio-based processing (e.g., rendering or a step of rendering, and/or decoding or a step of decoding) on audio input signal 101 in response to compression feedback 105, to generate enhanced audio signal 103. For example, enhancement performed by subsystem 102 may be or include bass enhancement, or another type of enhancement (e.g., any of those described herein).

In operation, limiter 104 performs multiband compression on signal 103 to generate output signal 106 (which may include one or more channels) for playback (or rendering and then playback) by a speaker system including at least one speaker. In some implementations (e.g., those to be described with reference to FIGS. 6 and 7), limiter 104 is replaced by two or more multiband limiters, each configured to generate audio output for playback by a different subset of the speakers of a multi-speaker implementation of a speaker subsystem (e.g., subsystem 109).

Optionally (e.g., in cases in which subsystem 102 implements multichannel audio-based processing other than rendering on audio input signal 101), the FIG. 3 system also includes mixed signal processing subsystem 108 and speaker subsystem 109 (coupled to subsystem 108). Subsystem 108 is coupled to limiter 104 (or each limiter of an implementation in which limiter 104 is replaced by two or more limiters) to receive output 106 of limiter 104 (or each limiter of a set of limiters which replaces limiter 104). In typical operation, the compressed, enhanced audio signal 106 output from limiter 104 is provided to subsystem 108, and subsystem 108 (with speaker subsystem 109) performs playback of audio content of the compressed, enhanced audio signal 106. Subsystem 108 is configured to generate a speaker feed for each speaker of subsystem 109 in response to (e.g., by performing digital-to-analog conversion on) the compressed, enhanced audio signal 106 (and thus subsystem 108 may be referred to as a rendering subsystem). Each speaker feed is provided to speaker subsystem 109, and speaker subsystem 109 is configured to emit sound in response to each speaker feed. Typically, the compression performed by limiter 104 (or each limiter employed in place of limiter 104) prevents the sound from being distorted.

Thus, subsystem 108 is configured to render audio content (indicated by the compressed, enhanced audio signal) by converting the content into at least one speaker feed, and subsystem 108 (together with speaker subsystem 109) is configured to render such audio content by converting the content into at least one speaker feed and converting each speaker feed to sound. In cases in which audio input signal 101 includes speaker channels (but no object channel), the rendering performed by subsystem 108 may include or consist of digital-to-analog conversion (and optionally also amplification) of each speaker channel output from limiter 104, to generate a speaker feed for each such speaker channel. In cases in which audio input signal 101 includes at least one object channel (e.g., as do typical examples of audio input signal 801 of FIG. 3A), subsystem 102 (or another system element not specifically shown in FIG. 3) may be configured perform object-based rendering (which typically includes mixing of audio content of object channel(s) to speaker channel(s)), and subsystem 108 may perform a rendering step consisting of (or including) digital-to-analog conversion of each speaker channel output from limiter 104, to generate a speaker feed for each such speaker channel.

Element 100 (and optionally also subsystem 108) of FIG. 3 may be a processor which is programmed (or otherwise configured) to perform an embodiment of the inventive method, and in which elements 102 and 104 (and optionally also subsystem 108) of FIG. 3 are implemented as subsystems (e.g., stages) of the processor. For example, elements 100 and 108 of FIG. 3 are implemented in a decoder or other audio processor (e.g., a device including a decoder and a post-processor coupled to process output of the decoder), or other device configured to perform audio signal processing. In another example, elements 100, 108, and 109 of FIG. 3 are implemented as a playback device (e.g., laptop computer) configured to perform an embodiment of the inventive method, and in which elements 102, 104, 108, and 109 of FIG. 3 are implemented as subsystems (e.g., stages) of the playback device.

Typically, multiband limiter 104 (or each limiter employed in place of it) has been tuned to limit when each speaker would distort. Feedback signal 105 is typically indicative of compression (gain) applied by limiter 104 (or each limiter employed in place of it) to each of a set of frequency bands (e.g., each band of a full set of frequency bands) of each channel (or each of one or more of the channel(s)) of signal 103. More generally, compression feedback 105 is indicative of amount of compression applied or to be (e.g., predicted to be) applied to each of at least one frequency band (e.g., each of at least two frequency bands) of (e.g., of at least one channel of) the enhanced audio signal, or power or amplitude of at least one channel of the enhanced audio signal, or state of a system volume control. For example, the compression feedback may be indicative of amount and/or type of distortion (e.g., harmonic and/or intermodulation distortion) predicted for relevant driver(s) or to be prevented by the multiband compression. Alternatively, compression feedback 105 is not provided by limiter 104, and/or is replaced by feedback from a smart amplifier (e.g., as described with reference to the FIG. 3A embodiment).

In typical operation of subsystem 102 in response to feedback 105, subsystem 102 changes the processing (e.g., enhancement) it performs on input signal 101 in response to the amount of compression (indicated by feedback 105) applied to at least one channel (e.g., each channel) of signal 103 by limiter 104 (or each limiter employed in place of it) in each of one or more frequency bands.

Next, with reference to FIG. 3A, another class of embodiments of the inventive method and system will be described. System 800 of FIG. 3A includes decoding subsystem 802 (e.g., a decoding subsystem configured to implement Dolby Digital Plus decoding) on multichannel audio input signal 801. Signal 801 includes at least two channels of encoded audio content. Typically, the channels are object channels, or include at least one object channel and at least one speaker channel.

System 800 also includes rendering subsystem 803, enhancement subsystem 805, multiband limiter 806, and smart amplifier 808, coupled as shown. Optionally, one or more of subsystems 802, 803, 805, 806, or 808, is/are omitted (with the constraint that at least one of subsystems 802, 803, or 805, and at least one of elements 806 or 808, is present and at least one of subsystems 802, 803, or 805 is provided with feedback 807 and/or feedback 809. For example, optionally, subsystem 805 and limiter 806 are omitted (and the output 804 of subsystem 803 is provided to amplifier 808), or amplifier 808 is omitted. Optionally, multiband limiter 806 is replaced by two or more limiters (e.g., two or more limiters as in the embodiment of FIG. 6 or 7). Typically, the audio signal which is output from limiter 806 or amplifier 808 (or one or more speaker feeds generated in response thereto) is provided to a speaker system (e.g., a speaker system identical to speaker subsystem 109 of FIG. 3), for playback of audio content of the audio signal. Typically, the compression performed by limiter 806 (or each limiter employed in place of limiter 806) prevents the sound emitted from the speaker system from being distorted.

Rendering subsystem 803 is coupled and configured to perform object-based rendering on the decoded audio channels output from subsystem 802, to generate one or more speaker channels 804 (sometimes referred to herein as signal 804). For example, subsystem 803 may generate N speaker channel(s) in response to M object channels (or object channels and speaker channels) generated by subsystem 802 in response to input signal 801, where N and M are numbers. Another element of system 800 (or a system coupled to system 800) may also perform digital-to-analog conversion (and optionally also amplification) of each speaker channel output from limiter 806 or amplifier 808, to generate a speaker feed for each such speaker channel. For example, the output (signal 811) of limiter 806 (implemented in software as a programmed processor) may undergo digital to analog conversion, followed by amplification (dumb, rather than smart, amplification) to generate speaker feed(s). For another example, smart amplifier 808 may implement smart amplification including digital-to-analog conversion on the output of limiter 806, so that the output (signal 813) of smart amplifier 808 is a set of one or more speaker feeds. Smart amplifier 808 may include structure similar to that of a software implementation of limiter 806, but the limiting implemented by amplifier 808 is typically driven by its excursion protection model, and amplifier 808 is wired directly (during use) to the speaker(s) since amplifier 808 provides analog amplification, and analog sensing and/or measurement.

Enhancement subsystem 805 is coupled and configured to generate audio signal 810 (which includes one or more channels, and which will sometimes be referred to herein as "enhanced audio signal" 810) in response to signal 804. Subsystem 805 may be implemented to perform (on signal 804) enhancement (e.g., multichannel enhancement) of any of the types described herein (e.g., of any of the types performed by an embodiment of subsystem 102 of FIG. 3).

Multiband limiter 806 which is coupled to subsystem 805 and configured to perform compression on frequency bands of at least one (and typically each) channel of enhanced audio signal 810, to generate compressed, enhanced audio signal 811. Multiband limiter 806 is also configured to generate compression feedback signal 807 which is typically indicative of an amount of compression applied by limiter 806 in each of at least one frequency band (e.g., each of at least two frequency bands) of each of at least one channel of signal 810. Subsystem 805 is coupled and configured to receive compression feedback 807 from limiter 806, and to perform enhancement (e.g., multichannel enhancement) on signal 804 in response to compression feedback 807, to generate enhanced audio signal 810. For example, enhancement performed by subsystem 805 may be or include bass enhancement, or another type of enhancement (e.g., any of those described herein). Subsystems 802 and 803 are typically also coupled and configured to receive feedback 807, and to perform decoding (or a step of decoding) or rendering (or a step of rendering) in response to feedback 807.

In operation, limiter 806 performs multiband compression on signal 810 to generate signal 811 (which may include one or more channels) for playback (or digital-to-analog conversion and then playback) by a speaker system including at least one speaker. In some implementations (e.g., those described with reference to FIGS. 6 and 7), limiter 806 is replaced by two or more multiband limiters, each configured to generate audio output for playback by a different subset of the speakers of a multi-speaker implementation of a speaker subsystem (e.g., subsystem 109).

Smart amplifier 808 is coupled and configured to perform smart amplification on signal 811 to generate signal 813. Signal 813 (which may include one or more channels) may be provided to a speaker system (including at least one speaker) for playback.

Amplifier 808 may be configured to implement analog to digital conversion and amplification, e.g., to generate a digital input. In some implementations, the input to amplifier 808 is an analog input, and amplifier 808 is configured to perform analog-to digital conversion, followed by processing, followed by digital-to-analog conversion, and finally amplification. In all cases, amplifier 808 is configured to perform amplification. Amplifier 808 is typically connected (wired) directly to a speaker subsystem, in order to measure the voltage and/or current and/or impedance of each driver to which it is connected.

Smart amplifier 808 is also configured to generate feedback signal 809, which may be of any of the types of smart amplifier feedback described herein. At least one (e.g., all) of subsystems 802, 803, and 805 is (or are) coupled and configured to receive feedback 809 from amplifier 808, and to perform decoding (or a step of decoding), rendering (or a step of rendering), or multichannel enhancement in response to feedback 809. For example, subsystem 802 may be coupled and configured to receive feedback 809 from amplifier 808 and to perform decoding (or a step of decoding) on signal 801 in response thereto. Subsystem 803 may be coupled and configured to receive feedback 809 from amplifier 808 and to perform rendering (or a step of rendering) on the output of subsystem 802 in response thereto, to generate signal 804. Subsystem 805 may be coupled and configured to receive feedback 809 from amplifier 808 and to perform multichannel enhancement in response thereto to generate signal 810.

In some implementations, smart amplifier feedback 809 is provided to limiter 806, e.g., for use by limiter 806 to adjust the excitations of limiter 806. In at least some such implementations; compression feedback 807 from limiter 806 may be indicative of feedback 809 (or feedback 807 may be indicative of at least one quantity related to feedback 809).

Figure 3A:
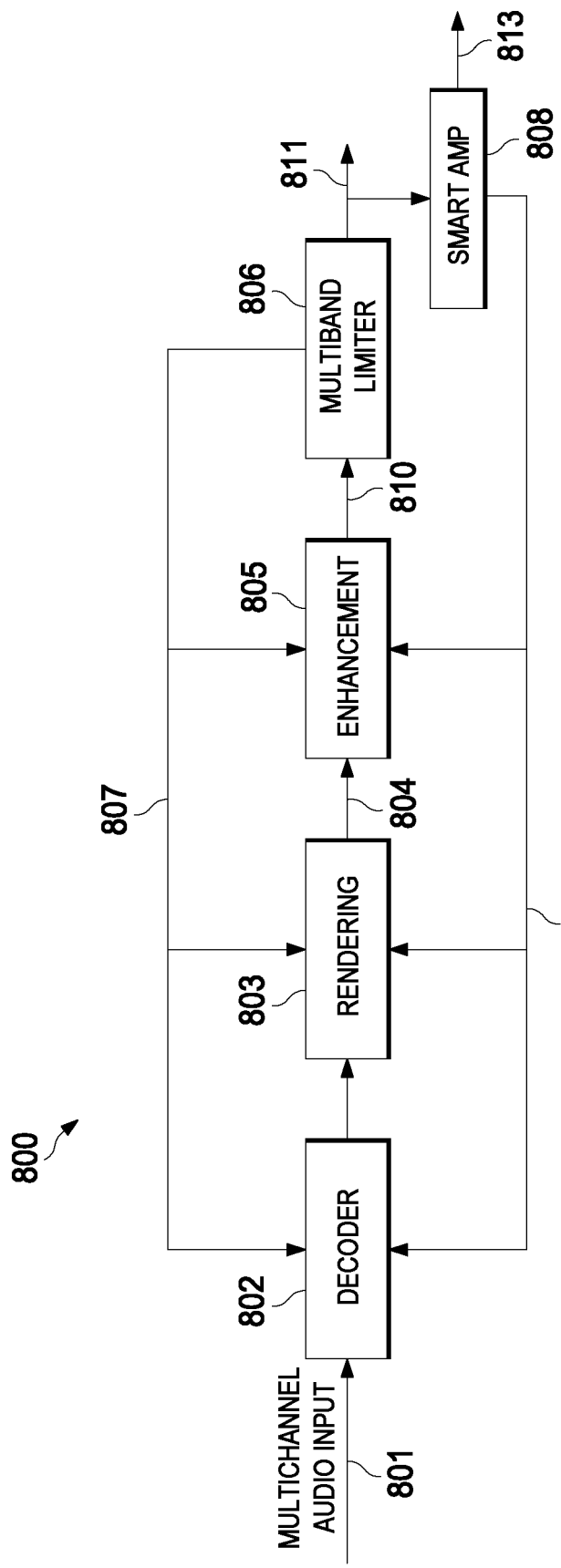
FIG. 3A is a block diagram of a system configured to perform decoding and rendering, and compression and/or amplification, and optionally also audio enhancement (e.g., bass enhancement), in accordance with an embodiment of the invention.

System 800 of FIG. 3A (or one or more of subsystems 802, 803, 805, 806, and 808 of system 800) may be a processor which is programmed (or otherwise configured) to perform an embodiment of the inventive method. For example, subsystems 802, 803, 805, 806, and/or 808 of system 800 may be implemented as subsystems (e.g., stages) of the processor. In one example, system 800 may be implemented in a decoder or other audio processor (e.g., a device including a decoder and a post-processor coupled to process output of the decoder), or other device configured to perform audio signal processing. In another example, system 800 is implemented as a playback device (e.g., laptop computer) configured to perform an embodiment of the inventive method, and in which elements 802, 803, 805, 806, and 808 of FIG. 3A are implemented as subsystems (e.g., stages) of the playback device.

Typically, multiband limiter 806 (or each limiter employed in place of it) has been tuned to limit when each speaker would distort. Feedback signal 807 is typically indicative of compression (gain) applied by limiter 806 (or each limiter employed in place of it) to each of a set of frequency bands (e.g., each band of a full set of frequency bands) of each channel (or each of one or more of the channel(s)) of signal 810. More generally, compression feedback 807 is indicative of amount of compression applied or to be (e.g., predicted to be) applied to each of at least one frequency band (e.g., each of at least two frequency bands) of (e.g., of at least one channel of) the enhanced audio signal, or power or amplitude of at least one channel of the enhanced audio signal, or state of a system volume control. For example, the compression feedback may be indicative of amount and/or type of distortion (e.g., harmonic and/or intermodulation distortion) predicted for relevant driver(s) or to be prevented by the multiband compression.

In some embodiments, the inventive system (e.g., subsystem 100 of FIG. 3, or system 800 of FIG. 3A or at least one subsystem of system 800) is configured to perform enhancement (other than, or in addition to, bass enhancement) to generate an enhanced audio signal (in response to a multichannel input audio signal) using compression feedback and/or feedback from a smart amplifier. We next describe examples of some types of such enhancement (e.g., performed by embodiments of subsystem 100 of FIG. 3 or system 800 of FIG. 3A) that can be controlled using compression feedback (and/or feedback from a smart amplifier) in some embodiments of the invention. The examples include:

1. Dialog Enhancement

When performing dialog enhancement (e.g., by operating an embodiment of subsystem 102 of FIG. 3 or subsystem 805 of FIG. 3A), the level of a dialog enhancement signal (e.g., generated by the embodiment of subsystem 102) may be decreased in response to compression feedback (e.g., from regulator 104) to limit the maximum level (in one or more specific bands) of the dialog-enhanced audio signal which is provided to the regulator, to cause such maximum level to be sufficiently low to prevent the regulator from compressing (limiting) audio in such band(s). If the level of the dialog enhancement signal is not so decreased when the regulator is limiting the dialog-enhanced audio signal (in at least one band), the dialog enhancement will often make the dialog (indicated by the compressed, dialog-enhanced audio signal output from the regulator) harder to understand rather than more intelligible.

In some embodiments, the shape of the dialog enhancement curve (employed to perform dialog enhancement) may be changed in response to the compression feedback, to reduce the gain of the dialog-enhanced audio signal in each band (which is outside the typical speech frequency range, i.e., 300-3000 Hz, and is being compressed by the regulator as indicated by the compression feedback), to prevent the regulator (e.g., regulator 104) from continuing to apply compression in each such band of the dialog-enhanced audio signal. For example, when subsystem 102 is configured to perform the dialog enhancement, the gain of subsystem 102's output in each band within the speech frequency range would typically not be reduced (but the gain of subsystem 102's output in each band outside the speech frequency range would in some cases be reduced) in response to the compression feedback. This can be done to ensure that a timbre preservation mode of the regulator (e.g., regulator 104) does not result in a compressed, dialog-enhanced audio signal (output from the regulator) that has dialog that is too quiet and still ensure that increases in user-controlled volume result in an increase in dialog volume;

2. Upmixing

When performing upmixing (e.g., by operating an embodiment of subsystem 102 of FIG. 3 or subsystem 805 of FIG. 3A), the amount of diffuse content (e.g., generated by the embodiment of subsystem 102) may be reduced (while keeping the direct content untouched) in response to compression feedback (e.g., from regulator 104), when the compression feedback indicates that the regulator is limiting relevant bands of the upmixed audio signal (i.e., relevant bands of at least one channel of multi-channel upmixed audio), to reduce the amount of energy of the upmixed audio signal that is fed into the regulator. Alternatively, the upmixing may be disabled (so that no upmixing is performed at all) in response to the compression feedback for specific time intervals in which the compression feedback indicates that this should be done;

3. Volume leveling, modeling, or automatic gain control (e.g., as implemented by Dolby Volume). When performing volume modeling (e.g., by operating an embodiment of subsystem 102 of FIG. 3 or subsystem 805 of FIG. 3A), the volume modeler may analyze incoming audio, group similar frequencies into critical bands, and apply appropriate amounts of gain to each band, in a manner controlled by compression feedback (e.g., from regulator 104) which compresses the output of the volume modeler. In response to the compression feedback, the volume modeler may adjust the frequency response for different playback levels (relative to an assumed reference level, which is typically around 85 decibels) to compensate for the way people perceive audio during playback at different playback levels. Thus, the volume modeling may assure that a user always hears the correct tonal balance, whether at high or low playback levels.

When performing volume leveling (e.g., by operating an embodiment of subsystem 102), the volume leveler may operate in a manner controlled by compression feedback (e.g., from regulator 104) which compresses the output of the volume leveler. The volume leveler may control playback level of input audio to maintain consistent playback level regardless of the source selection and content.

In some examples of implementations of subsystem 100 (or system 800), the enhancement subsystem may be controlled in response to compression feedback in any of the following ways:

a targeted reference level of a volume leveler or a reference level of a volume modeler (implemented by subsystem 102 or 805) may be adjusted in response to the compression feedback to ensure that subsystem 102 (or 805) is not driving (e.g., continuously driving) regulator 104 (or 806) to cause the regulator to compress audio in one or more specific bands. The targeted reference level may be calibrated using the regulator tuning; or the gain swing of automatic gain control (AGC) implemented by subsystem 102 (or 805) may be adjusted in response to the compression feedback to limit the maximum level of the output of subsystem 102 or 805 (in one or more specific bands) is sufficiently low to prevent regulator 104 (or 806) from compressing audio in such band(s);

4. Frequency Shift Block

To increase the speech intelligibility (e.g., of audio captured during conference calls), subsystem 102 (or 805) may be implemented as (or to include) a frequency shift block. When operating such an embodiment of subsystem 102, the frequency shift block may operate in a manner controlled by compression feedback (e.g., from regulator 104) which compresses the output of the frequency shift block. Typically, as a user increases the volume and the regulator starts limiting the frequency bands in the range of typical speech, the frequency shift block will shift all the frequencies in a direction that would give an increase in perceived volume taking into account the capabilities of the playback device (and optionally the noise level in the surrounding environment);

5. Harmonic Injection

In the case where bands are being limited by a regulator, compression feedback from the regulator can be provided to an embodiment of subsystem 102 (or 805). The subsystem can operate in response to the compression feedback to inject harmonic psychoacoustic frequencies into an audio input signal (e.g., to provide virtual bass) and thereby generate an enhanced signal which is provided to the input of the regulator. It should be noted that harmonic injection in this context is not limited to the traditional bass frequencies. It can be performed at all frequencies (with a fundamental frequency up to 12 KHz; after which the second harmonic is above the human hearing threshold);

6. Subharmonic Injection

When a signal is being limited in higher frequency bins by a regulator, compression feedback from the regulator can be provided to an embodiment of subsystem 102 (or 805). The subsystem can operate in response to the compression feedback to generate subharmonics (having frequencies equal to (Fundamental frequency)/(n), where n is an integer) and to insert the subharmonics into an audio input signal, thereby generating an enhanced signal which is provided to the input of the regulator. This has the advantage of working all the way up to 24 Khz. This will allow the perceived volume to increase when a user increases a volume control. In other embodiments, the audio that is injected (to generate the enhanced signal) is not a harmonic or subharmonic of a fundamental frequency (e.g., a "fundamental frequency" which is a frequency of a band of significance, as indicated by compression feedback, or by feedback from a smart amplifier). For example, to enhance audio content for playback by a bass speaker by injecting therein audio having a selected frequency which is below a fundamental frequency (where the fundamental frequency is a frequency of a band of significance, as indicated by the feedback), the selected frequency may not be a subharmonic of the fundamental frequency, and may instead be determined based on the location of the resonant peak of the speaker (since the speaker may not be capable at the subharmonic);

7. Virtualization

When performing virtualization (e.g., by operating an embodiment of subsystem 102 or 805), the virtualizer may operate in a manner controlled by compression feedback (e.g., from regulator 104) which compresses the output of the virtualizer. Virtualizers generally cause a volume change that might cause the regulator to limit certain bins. In some cases, this would undesirably cause a collapse in spatial audio, unless operation of the virtualizer is controlled (in accordance with an embodiment of the invention) by the compression feedback.

An example of virtualization in response to compression feedback is described with reference to FIG. 10. In another example of virtualization in response to compression feedback, the virtualizer does not virtualize a height filter in the case where it is causing (as indicated by the compression feedback) the regulator to limit a band, and instead just renders the audio to the listener plane. In another example of virtualization in response to compression feedback, the virtualizer reduces the amount of reverb (the "wet" component) within the signal and just keeps the anechoic feed (the "dry" component) when the regulator is limiting the relevant bins (as indicated by the compression feedback); or 8. Equalization When performing equalization (e.g., by operating an embodiment of subsystem 102 or 805), the equalizer may operate in a manner controlled by compression feedback (e.g., from regulator 104) which compresses the output of the equalizer. An equalizer preset may cause the regulator to start limiting certain bins. The equalizer may decide (in response to the compression feedback) to change to another preset to avoid the limiting that occurs (as indicated by the compression feedback) due to the regulator component.

In some embodiments; the inventive system (e.g., subsystem 102 of FIG. 3 or the system of FIG. 3A) is configured to perform enhancement in response to compression feedback which indicates that compression is being applied in only in one band (e.g., the compression feedback indicates that no (a zero amount of) compression is being applied in each other band). For example, if regulator 104 is a multi-band limiter with the bands 1-1000 Hz and 1000-20000 Hz, and if the content consists of a 500 Hz sine wave and this causes the speaker to distort, the regulator will not apply compression to the top band (1000-20000 Hz) and the compression feedback will indicate this.

In some embodiments, the inventive system (e.g., subsystem 100 of FIG. 3, or system 800 of FIG. 3A or a subsystem thereof) is configured to perform enhancement (in response to compression feedback) in the time domain. For example, the enhancement may apply parametric filters (which may be implemented as time domain biquad filters). These parametric filters may be used to implement an equalization bass enhancement. For another example, the enhancement may apply a parametric low pass filter that adjusts its knee point based upon the compression feedback.

We next describe aspects of embodiments in which at least one of decoding, rendering, or audio enhancement is performed in response to feedback from a smart amplifier (e.g., feedback 809 from smart amplifier 808 of FIG. 3A). The feedback may be indicative of temperature, voltage, current, impedance, or resistance, of at least one speaker (e.g., at least one coil of at least one speaker).

Smart amplifiers typically employ broadband compression for temperature protection. If they are employing broadband compression, the bass distribution strategy may have two modes, one mode employing no bass distribution and another mode that employs bass distribution with a fixed cutoff (e.g., 400 Hz), with a sliding cutoff when transitioning between the two modes. If a smart amplifier is applying multiband compression, temperature broadband limiting may be implemented by clipping the maximum excitation values per frequency bin (i.e., the equivalent of applying a broadband limit) and allowing low level signals not to be limited and distributed. The feedback employed in some embodiments of the invention may be indicative of the state of such limiting.

In some embodiments, audio may be rerouted (e.g., channels of multichannel audio may be routed to different elements of an audio enhancement subsystem) in response to feedback (e.g., temperature feedback) from a smart amplifier, before limiting occurs (i.e., limiting implemented by the smart amplifier) to protect the speaker(s) and ensure that the limiting is less likely to occur and that volume is maintained.

Smart amplifiers typically implement multiband compression for excursion protection. A smart amplifier which implements multiband compression is considered (in the present disclosure) to be a multiband limiter, and feedback generated by such a smart amplifier (and applied to control at least one aspect of at least one of audio enhancement, decoding, or rendering in accordance with an embodiment of the present invention) is considered (in the present disclosure) to be compression feedback.

In some embodiments of the present invention, decoding, rendering, and/or audio enhancement is performed in response to compression feedback (e.g., feedback indicative of amount of compression applied or to be (e.g., predicted to be) applied to each of at least one frequency band (e.g., each of at least two frequency bands) of a multichannel audio signal, or thresholds of a multiband limiter, or power or amplitude of at least one channel of the multichannel audio signal, or state of a system volume control), and/or feedback from a smart amplifier. For example, audio enhancement (e.g., including re-routing of channels of audio content) is performed in response to the feedback so as to prevent a multiband limiter from limiting or to improve audio quality when a multiband limiter is limiting.

The feedback from the smart amplifier (e.g., indicative of current (e.g., in cases in which it is desired to preserve battery life) or temperature) may be employed to reduce the amount of energy that is sent to the speaker system in a way that prioritizes the important audio content. Use of such feedback (rather than compression feedback indicative of amount of compression applied by a multiband limiter) may be desirable to prevent the smart amplifier (or a multiband limiter) from applying compression. For example, if the feedback indicates that temperature (of a speaker) is creeping up slowly, the decoding, rendering, and/or enhancement may be performed (in response to the feedback) so as to reduce gradually reduce the energy that is being sent to the speaker before it is necessary to apply harsh compression.

Figure 4:
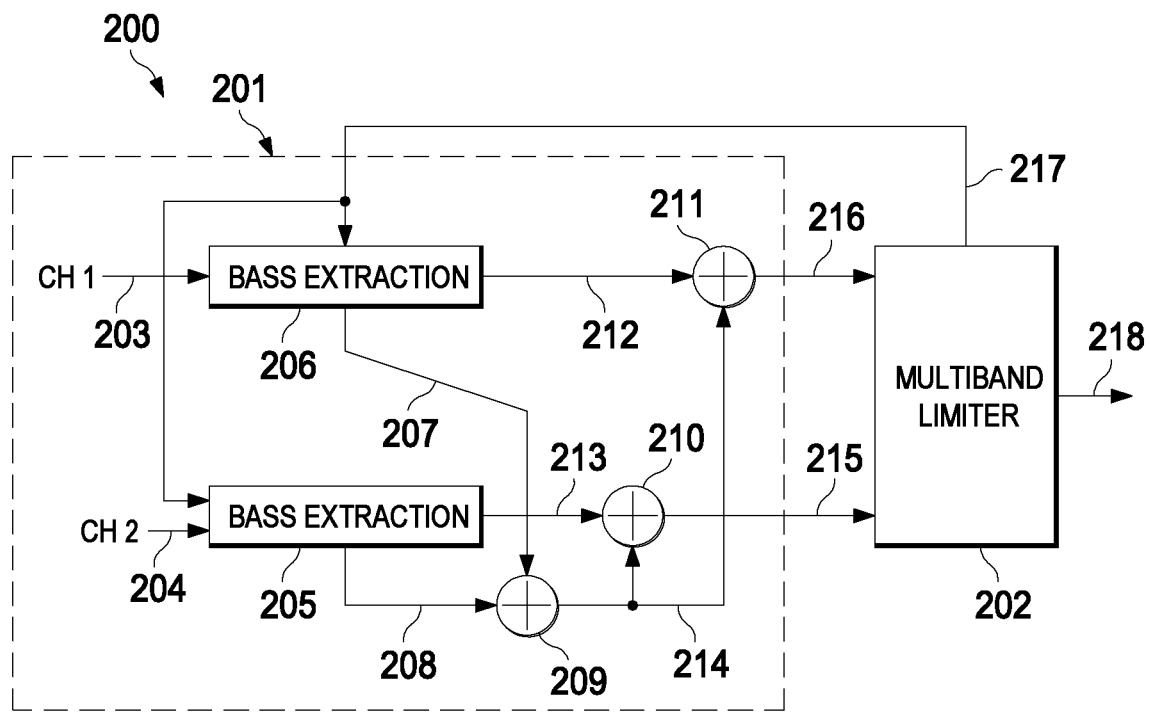
FIG. 4 is a block diagram of a system configured to perform bass enhancement and compression in accordance with an embodiment of the invention.

With reference to FIG. 4, we next describe an example embodiment (system 200) of the system of FIG. 3 or FIG. 3A. In system 200 of FIG. 4, bass volume enhancer (bass extracting mixer) 201 is an implementation of subsystem 102 of FIG. 3, and the multichannel audio input signal provided to enhancer 201 includes first channel 203 and second channel 204. It should be appreciated that in some variations of the FIG. 4 embodiment, the multichannel audio input provided to enhancer 201 includes "n" channels (where "n" may be equal to 2, or not equal to 2). Each channel of the audio input may be a speaker channel or an audio object.

In system 200, multiband limiter 202 and compression feedback signal 217 (generated by limiter 202 and provided to enhancer 201) may be identical, respectively, to limiter 104 and compression feedback signal 105 of FIG. 3. In some implementations, limiter 202 may be configured to generate feedback signal 217 such that feedback signal 217 is indicative only of an amount of compression applied by limiter 202 in at least one low frequency band (or each of at least two low frequency bands), in a low frequency range (e.g., up to 500 Hz), of at least one channel (e.g., one or both of channels 215 and 216) provided from enhancer 201 to limiter 202. The audio output of limiter 202 (in response to channels 215 and 216) is multichannel audio output signal 218. Typically, limiter 202 operates on a sequence of blocks of audio values (provided thereto by enhancer 201), and feedback signal 217 is indicative (in a relevant time window) of the gain(s) applied by limiter 202 to the audio value(s) in each different frequency band of the current block.

Bass volume enhancer 201 of FIG. 4 (and typical ones of the noted variations thereof) generates (and provides to multiband limiter 202) a bass-enhanced output audio channel (channel 215 or 216) in response to each input audio channel (203 or 204). Bass volume enhancer 201 is coupled and configured to vary the cutoff frequency of at least one bass extraction filter thereof (e.g., each of filters 205 and 206 of FIG. 4) in response to the amount of compression (as indicated by feedback 217) applied (in each of at least two frequency bands) by multiband limiter 202, and to generate a bass-enhanced audio signal (e.g., an enhanced audio signal including channels 215 and 216, as shown) in response to the input signal channels (e.g., channels 203 and 204 as shown) provided thereto.

Typically, enhancer 201 generates (extracts) a low frequency audio signal (e.g., each of signals 207 and 208 of FIG. 4) from each channel (or each of at least two channels) of the input audio signal provided thereto, sums together each extracted low frequency audio signal to generate a summed signal (e.g., signal 214 of FIG. 4) which is a monophonic low frequency signal, and then mixes the summed signal back (at a particular level) into each of the channels from which a low frequency audio signal was extracted (e.g., mixes the summed signal with high frequency audio content of each channel of the input audio signal provided to enhancer 201) to generate bass-enhanced output channels (e.g., output channels 215 and 216 of FIG. 4).

Still with reference to FIG. 4, it should be appreciated that many modern laptops and soundbars (and other modern devices which output sound or at least one audio signal) provide limited (e.g., weak) bass performance. Such devices can be produced or modified to implement the FIG. 4 embodiment of the invention (or variations thereof), in order to increase their output bass volume by dynamically routing low frequency audio content between channels. This trades spatial fidelity by spreading the bass content across multiple channels by downmixing it to mono (e.g., to monophonic signal 214 of FIG. 4) and then remixing it into (i.e., mixing it with high frequency content of) the original channels. This is especially desirable in cases in which the bass (or other low frequency content) of input audio content has more energy in some channels (of the input audio content) than in other channels. Such cases are common, e.g., where the input audio content is songs by "The Beatles" or Dolby Atmos (or other object-based audio) content. In this context, loss of spatial fidelity is typically acceptable because bass is less directional than high frequency content and users generally value loudness (of low frequency content) over spatial fidelity.

Bass volume enhancer 201 of FIG. 4 is configured to change the routing of low frequency content of input audio provided thereto in response to amount of compression applied by multiband limiter 202 in order to handle power characteristics of the speaker(s) of a playback (or rendering and playback) system to which the output of limiter 202 is provided. An advantage of the FIG. 4 system is that multiband limiter 202 makes the system stable, since any excessive (too aggressive) gains applied in element 209, 210, and/or 211 of FIG. 4 are limited (by limiter 202) to be within what the relevant speaker(s) can handle.

The FIG. 4 system scales with the number of speakers. For example, a variation on enhancer 201 of FIG. 4 can include N branches (where N is an integer greater than 2), each branch including a bass extractor and mixing element, for generating N bass enhanced output signals (rather than two bass enhanced output signals, 215 and 216, as in FIG. 4) each for provision to a multiband limiter (e.g., limiter 202). In this example, mixing element 209 (of FIG. 4) is replaced by a mixing element which sums together N low frequency signals (each of which is extracted in a different one of the branches) to generate a monophonic low frequency signal which is mixed with the high frequency content extracted by each of the branches (or mixing element 209 is replaced by a mixing element which sums together only a subset of the N low frequency signals extracted in the branches, to generate the monophonic low frequency signal which is mixed with the high frequency content extracted by each of the branches). For another example, another variation on the FIG. 4 system can include M instances (where M is an integer greater than 1) of system 200 of FIG. 4, each instance including a bass volume enhancer (e.g., enhancer 201 or a variation thereon) and a multiband limiter, so that each instance of the bass volume enhancer enhances a different subset of a full set of input channels, and each instance of the limiter compresses the output of one of the bass volume enhancers for playback (or rendering and playback) by a different subset of a full set of speakers.

We next describe in more detail the implementation of enhancer 201 shown in FIG. 4. This implementation includes bass extraction filters 205 and 206, and mixing elements 209, 211, and 212, coupled together as shown in FIG. 4. Each of bass extraction filters 205 and 206 has a cutoff frequency which is controlled by compression feedback 217.

Bass extraction filter 205 is configured to extract (from input channel 204) high frequency content (signal 213) in a high frequency range above the cutoff frequency, and low frequency content (signal 208) in a low frequency range below the cutoff frequency. Bass extraction filter 206 is configured to extract (from input channel 203) high frequency content (signal 212) in a high frequency range above the cutoff frequency, and low frequency content (signal 207) in a low frequency range below the cutoff frequency. The cutoff frequency is controlled by the amount of limiting (as indicated by feedback 217) that is being performed in limiter 202 (typically, only in a low range of frequencies, for example up to 500 Hz, but alternatively in a wider or full range of frequencies). Typically, compression feedback 217 is indicative of (and the cutoff frequency of each of filters 205 and 206 is determined by) an amount of compression applied by limiter 202 in each of at least two low frequency bands of a low range of frequencies (e.g., up to 500 Hz). Alternatively, compression feedback 217 is indicative of (and the cutoff frequency of each of filters 205 and 206 is determined by) an amount of compression applied by limiter 202 in frequency bands in a wider or full range of frequencies.

Mixing element 209 is coupled and configured to sum together (e.g., generate a weighted sum of) the low frequency signals 207 and 208 extracted by filters 205 and 206, to generate a monophonic low frequency signal (channel) 214. Signal 214 is provided to each of mixing elements 210 and 211. High frequency signal 212 (extracted by filter 206) is also provided to mixing element 211, and element 211 sums together signals 214 and 212 to generate bass-enhanced output audio channel 216. High frequency signal 213 (extracted by filter 205) is provided to mixing element 210, and element 210 sums together signals 214 and 213 to generate bass-enhanced output audio channel 215.

In a typical implementation, each of filters 205 and 206 is configured to determine the cutoff frequency ("targeted_cutoff" in the formulas below) in accordance with the following formulas:

$$\text{targeted\_cutoff} = \text{total\_gain\_ratio} * \text{max\_freq\_limiting} * \text{aggressiveness},$$

where "aggressiveness" is a parameter indicative of aggressiveness of bass volume enhancement (this parameter may be tuned by ear, e.g., by the user or algorithm creator, to ensure that the system does not include too much or too little energy in monophonic low frequency signal (channel) 214), "max_freq_limiting" is the maximum frequency covered by a band that s being limited in the regulator (it is typically determined by, or derived directly from, the highest frequency of the highest-frequency band that is being limited by the regulator. In some implementations, it is clipped to the range that the bass extraction filter supports), and $$\text{"total\_gain\_ratio"} = \text{total\_gain}/\text{max\_possible\_gain},$$

where

"max_possible_gain" is the sum of the maximum gains of every band that is being limited (at the time) by limiter 202 for all bands that may be bass extracted in element 205 or 206 (or all bands that may be limited in limiter 202, in some embodiments). It is the sum of the maximum gains that may be applied (by limiter 202) for all bands that may be bass extracted (in element 205 or 206) in the sense that it is the maximum integral of all the gains that may be applied (by limiter 202) for the bins having frequency that do not exceed a maximum cutoff frequency of element 205 or 206, and "total_gain" is the sum of all gains being applied (as indicated by the feedback 217 from multiband limiter 202 for each frequency band) to all bands that may be bass extracted (or all bands that may be limited, in some embodiments).

The "total_gain_ratio" is an indicator of how much the regulator (limiter 202) is limiting overall within all the bands that may be bass extracted (in element 205 or 206). It is normalized (by the "max_possible_gain" parameter) so that it gives a better indication of the overall amount of limiting that is occurring for a variable number of bands.

The cutoff frequency ("targeted_cutoff" in the above formula) for each of filters 205 and 206 is increased, to increase the amount of bass enhancement applied, when the limiter is applying more limiting (e.g., when "total_gain_ratio" in the formulas is increased). The cutoff frequency for each of filters 205 and 206 is decreased, to decrease the amount of bass enhancement applied, when the limiter is applying less limiting (e.g., when "total_gain_ratio" in the formulas is decreased).

The cutoff frequency (i.e., "targeted_cutoff" in the above formulas) is preferably smoothed out with an attack and release to ensure the user does not notice sudden jumps in the panning.

If limiter 202 is not limiting (compressing), the cutoff frequency becomes so low that both low frequency content signals (207 and 208) are silent or substantially silent. As compression by limiter 202 increases (e.g., in one or more frequency bands, or across more bands), the cutoff frequency (of each of filters 205 and 206) increases so that the energy of each of signals 207 and 208 typically increases (and the energy of each of signals 212 and 213 typically decreases correspondingly), until the compression increases to a threshold amount at (and above) which the cutoff frequency (of each of filters 205 and 206) reaches its maximum value (e.g., 500 Hz). Thus, as limiter 202 applies more compression, the monophonic low frequency signal 214 is boosted, causing audio output signal 218 of limiter 202 to be indicative of more monophonic ("mono") bass. As limiter 202 applies less compression, the energy of monophonic low frequency signal 214 is reduced (causing the audio output signal 218 of limiter 202 to be indicative of less mono bass). Signal 218 can thus provide increased bass performance (relative to that which input signal channels 203 and 204 could themselves provide, if provided directly to limiter 202), without causing the relevant speaker(s) to distort.

In some implementations, the maximum cutoff frequency for filters 205 and 206 is less than 500 Hz (to exclude more, or all, midrange content from signal 214) or greater than 500 Hz.

Figure 5:
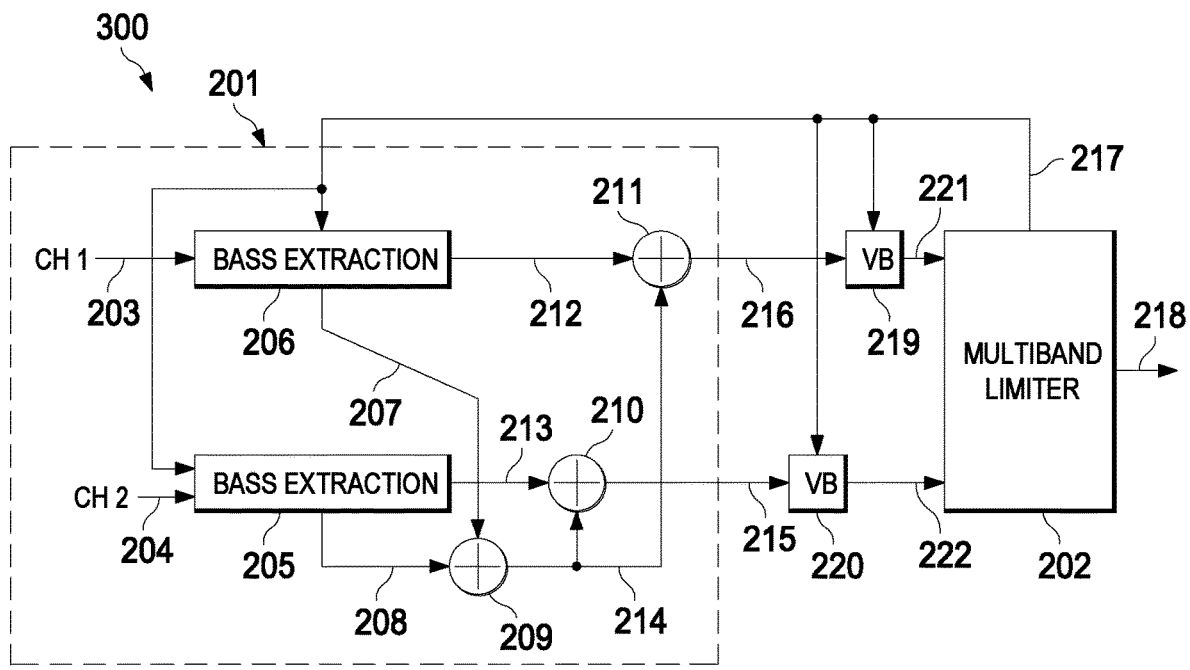
FIG. 5 is a block diagram of a system configured to perform bass enhancement (with virtual bass application) and compression in accordance with an embodiment of the invention.

The system of FIG. 4 can be further enhanced by adding a virtual bass subsystem (e.g., a stage or other subsystem which applies virtual bass) that is also controlled by compression feedback from the multiband limiter. For example, FIG. 5 is a block diagram of an embodiment (system 300) of the inventive system which includes the system of FIG. 4, and also a virtual bass stage comprising elements 219 and 220. Other embodiments of the invention implement only virtual bass enhancement (e.g., as implemented by one or both of elements 219 and 220) in response to compression feedback (e.g., feedback 217 from limiter 202), but not bass volume enhancement of the type implemented in the FIG. 5 embodiment by subsystem 201.

In system 300 of FIG. 5, the virtual bass stage (implemented by elements 219 and 220) is coupled and configured to apply virtual bass to each of channels 215 and 216 (which are output from subsystem 201), to generate enhanced channels 221 and 222 which are provided to limiter 202. Alternatively, the virtual bass stage (219 and 220) can be coupled and configured to apply virtual bass to each of input channels 203 and 204 to generate enhanced channels, these enhanced channels are provided to elements 205 and 206 of subsystem 201, so that the audio content of the output channels (215 and 216) of subsystem 201 have undergone both virtual bass enhancement (in response to compression feedback from limiter 202) followed by enhancement in subsystem 201 (also in response to compression feedback from limiter 202).

In the FIG. 5 system, each of virtual bass elements 219 and 220 is configured to add harmonics (of a missing fundamental) to the channel (channel 216 or 215) it receives when the missing fundamental (a "missing" fundamental frequency) cannot be reproduced or reproduced well (relying on the well-known missing fundamental phenomenon). The compression feedback 217 from limiter 202 is indicative of whether such a fundamental (in a frequency band in which limiter 202 can apply compression) cannot be reproduced or reproduced well. Thus, multiband limiter 202 provides feedback to each of elements 219 and 220 which is indicative of whether each relevant fundamental can be reproduced (or reproduced well). In a typical implementation, each of virtual bass elements 219 and 220 adds only one harmonic in response to a non-reproducible (and thus "missing") fundamental, since adding more is typically too aggressive and sounds artificial.

In the example implementation described below, each of elements 219 and 220 inspects the first (lowest) band (in the sense that it responds to the lowest frequency band indicated by feedback 217) to determine whether it includes a missing fundamental frequency. The example implementation set forth below, element 219 (or 220) determines the amount of virtual bass ("virtual bass gains") it applies, in response to compression feedback 217 from limiter 202, as indicated by the following exponential formula:

$$\text{virtual\_bass\_gains} = \text{min\_virtual\_bass\_gain} + ((1+0.01 \times A)^{-regulator\_gain} - 1)$$

where

"regulator_gain" is the regulator gain value (fed back from multiband limiter 202 to the relevant one of element 219 or 220) for the lowest frequency band;

"A" is a parameter indicative of aggressiveness of virtual bass application (i.e., how much virtual bass is applied per amount of regulator gain), e.g., A=−25; and "min_virtual_bass_gain" is the minimum amount of virtual bass gain applicable.

Alternative methods (e.g., log and linear formulas, in contrast with an exponential formula as set forth above) may be implemented to determine the amount of virtual bass applied (e.g., by element 219 or 220) in response to the compression feedback from the multiband limiter. In at least some applications, an exponential formula (e.g., as set forth above) is superior since it prevents application of significant virtual bass until it is necessary to do so.

In FIG. 5, the output channel of virtual bass element 219 (channel 221) and the output channel of virtual bass element 220 (channel 222) should have no harmonics (virtual bass) added therein when multiband limiter 202 is not limiting in the lowest band. When limiter 202 is limiting in the lowest band (as indicated by feedback 217), then elements 219 and 220 should add harmonics into channels 221 and 222 (because the fundamental will be missing, or poorly reproduced, from the output of the speaker(s) which play back the relevant content).

It is often desirable to implement both virtual bass enhancement (e.g., by operation of elements 219 and 220) and bass distribution (e.g., by operation of subsystem 201) together since they typically act at different times within a program (e.g., a song) and complement each other.

Figure 6:
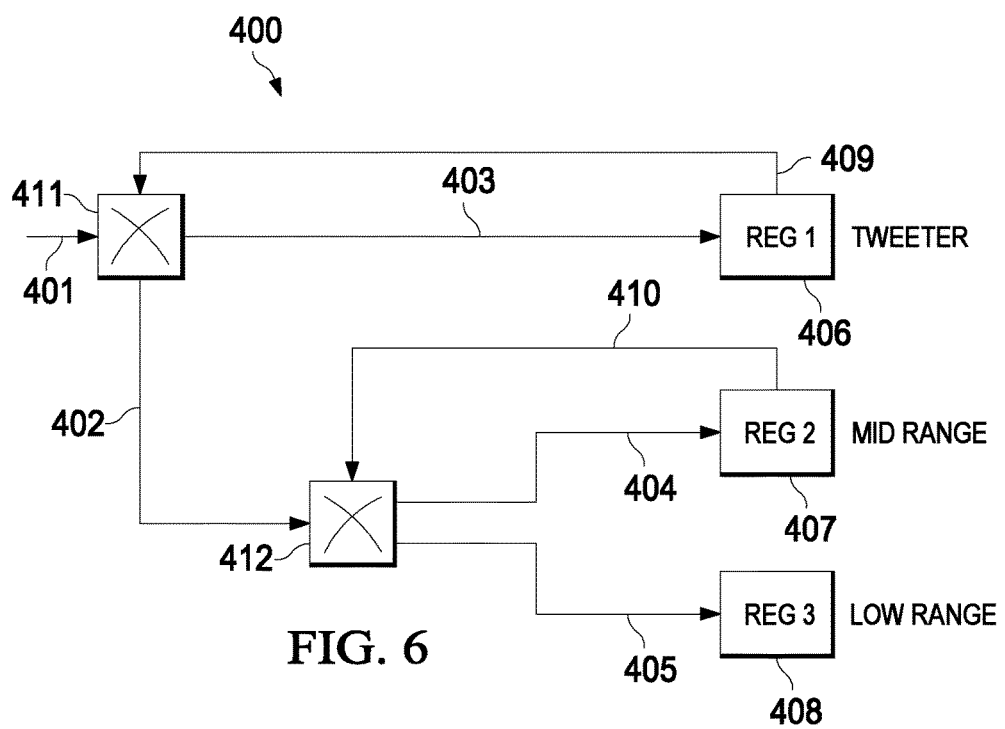
FIG. 6 is a block diagram of a system configured to perform audio enhancement and compression (on a per speaker class basis) in accordance with an embodiment of the invention.

With reference to FIG. 6, we next describe an embodiment of the inventive system which is useful in connection with playback of audio by multispeaker devices (especially those including speakers of different classes), and which employs more than one multiband limiter (i.e., a multiband limiter per speaker class) to implement dynamic crossovers.

In a commercially important class of multispeaker devices, each such device includes (or is used to drive) at least two speakers having very different characteristics. Traditionally, the playback of audio by such a device has been protected using a global multiband limiter to preserve spatial integrity. Using multiple limiters in accordance with a class of embodiments of the invention (e.g., the FIG. 6 embodiment), in which the limiters include one limiter per class of speaker, can improve the power handling of (and typically also the audio playback implemented using) such a device.

FIG. 6 is a block diagram of a system (system 400) configured to perform audio enhancement and compression (on a per speaker class basis) in accordance with an embodiment of the invention. System 400 is configured to perform audio enhancement in the sense of filtering and routing the audio content according to the speaker handling characteristics at the time of playback. This routing is acceptable since the bass content generally is not very directional when played. System 400 includes multiband limiters (406, 407, and 408) which are employed on a per speaker class basis in the sense that:

limiter 406 performs multiband compression on a signal (signal 403) to generate an output signal (having one or more channels) for playback (or rendering and then playback) by one or more tweeters (e.g., of a multispeaker device);

limiter 407 performs multiband compression on a signal (signal 404) to generate an output signal (having one or more channels) for playback (or rendering and then playback) by one or more mid-range speakers (e.g., of the same multispeaker device); and limiter 408 performs multiband compression on a signal (signal 405) to generate an output signal (having one or more channels) for playback (or rendering and then playback) by one or more low-frequency range speakers (e.g., of the same multispeaker device).

In typical implementations, each of limiters 406 and 407 provides compression feedback that controls the content and routing of sets of channels to all the limiters (406, 407, and 408) on a frequency dependent basis using crossovers. In typical ones of these implementations, compression feedback 409 from limiter 406 is indicative of compression applied by limiter 406 in each of at least two frequency bands of each of channel(s) 403, and compression feedback 410 from limiter 407 is indicative of compression applied by limiter 407 in each of at least two frequency bands of each of channel(s) 404. Typically, each of feedback 409 and feedback 410 is indicative of regulator gains (applied by the relevant one of limiters 406 and 407), but alternatively each can be indicative of compression feedback of another type. In some alternative implementations, each of feedback 409 and feedback 410 is replaced by (or includes) feedback other than compression feedback (e.g., feedback indicative of amount of harmonic and/or intermodulation distortion predicted for the relevant driver(s), or other feedback resulting from a mechanism other than gain application by a multiband limiter).

For example, in some implementations, feedback 409 is replaced by (or indicative of) feedback indicative of either the power or amplitude of signal 403 entering limiter 406 within at least one band, and feedback 410 is replaced by feedback indicative of either the power or amplitude of signal 404 entering limiter 407 within at least one band. This allows the cutoff frequency of each of elements 411 and 412 to start fading (changing) before the speaker(s) start distorting. More generally, feedback 409 and/or 410 may be indicative of power or amplitude of at least one of the signal(s) to be compressed by at least one of multiband limiters 406, 407, or 408). Reasons for employing feedback of the types noted in this paragraph include: operation of the system in accordance with a psychoacoustic model in which perceived loudness is different at different volume levels for different frequencies; and/or preserving each speaker over a longer term (in some cases, use of compression feedback indicative of regulator gains may allow some distortion through to the speakers); and/or increasing electrical efficiency.

For another example, in some implementations, feedback 409 and 410 are replaced by (or indicative of) feedback indicative of state of a system volume control (which may be indicative of power or amplitude of at least one of the signal(s) to be compressed by at least one of multiband limiters 406, 407, or 408).

For another example, in some implementations, feedback 409 and 410 are replaced by (or indicative of) feedback indicative of amount and type of distortion that is being or is to be blocked (by operation of the multiband limiters). Such feedback is an example of compression feedback indicative of amount of compression to be (e.g., predicted to be) applied by limiter 104. For example, 5% total harmonic distortion and 4% intermodulation distortion may be occurring due to the signals within a particular band. If intermodulation distortion is high then the system's processing may be applied differently (e.g., to generate each set of channels 403, 404, and 405 to have different content and/or number of channels) than if harmonic distortion is at a similar percentage (since intermodular distortion typically sounds much worse).

The input audio signal (signal 401) provided to the FIG. 6 system is a multichannel audio signal including a set of "n1" channels (which are typically full bandwidth channels).

The FIG. 6 system also includes:

crossover and gain stage 411 which is configured to split and filter (high-pass filter and low-pass filter) multichannel input audio signal 401 (including "n1" channels) into high frequency channel(s) 403 (comprising "n2" channels of high frequency components) and low frequency channels(s) 402 (comprising "n3" channels of low frequency components) in response to compression feedback 409 from limiter 406, where n1, n2, and n3 are integers. Compression feedback 409 provided from limiter 406 to stage 411 is preferably smoothed (with different attack and release times) to ensure the dynamic nature of the system is masked from the user; and crossover and gain stage 412 which is configured to split and filter (high-pass filter and low-pass filter) low frequency channel(s) 402 into relatively high frequency channel(s) 404 (comprising "n4" channels of high frequency components) and relatively low frequency channels(s) 405 (comprising "n5" channels of low frequency components) in response to compression feedback 410 from limiter 407, where n4 and n5 are integers. Compression feedback 410 provided from limiter 407 to stage 412 is preferably smoothed (with different attack and release times) to ensure the dynamic nature of the system is masked from the user.

Stage 411 has a first crossover frequency (controlled in response to compression feedback 409), and channel(s) 403 include high-pass filtered content (of signal 401) having frequency above the first crossover frequency, as filtered by high pass filter(s) of stage 411. Channel(s) 402 include low-pass filtered content (of signal 401) having frequency below the first crossover frequency, as filtered by low pass filter(s) of stage 411. The gains applied by stage 411 to channels 401 (to generate channels 402 and 403) are also controlled in response to the compression feedback 409.

Stage 412 has a second crossover frequency (controlled in response to compression feedback 410), and channel(s) 404 include high-pass filtered content (of channel(s) 402) having frequency above the second crossover frequency, as filtered by high pass filter(s) of stage 412. Channel(s) 405 include low-pass filtered content (of channel(s) 402) having frequency below the second crossover frequency, as filtered by low pass filter(s) of stage 412. The gains applied by stage 412 to channel(s) 402 (to generate channels 404 and 405) are also controlled in response to the compression feedback 410.

Multiband limiter 406 for the tweeter class of speakers limits the "n2" channels 403 and thus speaker feeds corresponding thereto. Each of channels 403 may be a speaker feed (in which case there are "n2" tweeters), or speaker feeds can be generated in response to channels 403.

Multiband limiter 407 for the mid-range class of speakers limits the "n4" channels 404 and thus speaker feeds corresponding thereto. Each of channels 404 may be a speaker feed (in which case there are "n4" mid-range speakers), or speaker feeds can be generated in response to channels 404.

Multiband limiter 408 for the low-range class of speakers limits the "n5" channels 405 and thus speaker feeds corresponding thereto. Each of channels 405 may be a speaker feed (in which case there are "n5" low-range speakers), or speaker feeds can be generated in response to channels 405.

The FIG. 6 system scales with the number of speaker types (classes). For example, where there are "X" classes of speakers (where X is some integer), a scaled version of the FIG. 6 system may include "X" limiters and "X−1" (e.g., a cascade of "X−1") crossover and gain stages. Although the FIG. 6 system includes a cascade of two crossover and gain stages (411 and 412), in variations on the FIG. 6 embodiment (or scaled versions thereof), the crossover and gain stages may be implemented in parallel (rather than as a cascade) to reduce the latency of the system's response to limiting.

System 400 of FIG. 6 (or variations thereon) can be further extended by implementing bass volume enhancement (e.g., of a type implemented in system 200 of FIG. 4) and/or virtual bass enhancement (e.g., of a type implemented in elements 219 and 220 of system 300 of FIG. 5) and/or another type of audio enhancement. System 500 of FIG. 7 is an example of such a combined system.

System 500 is configured to perform audio enhancement including bass enhancement (and filtering and routing of the audio content according to the speaker handling characteristics at the time of playback). In system 500, bass content is distributed (e.g., as described with reference to system 200) to different speakers within each class, and/or virtual bass enhancement is performed (e.g., as described with reference to system 300), in response to compression feedback from each multiband limiter (i.e., each of limiters 406, 407, and 408).

Figure 7:
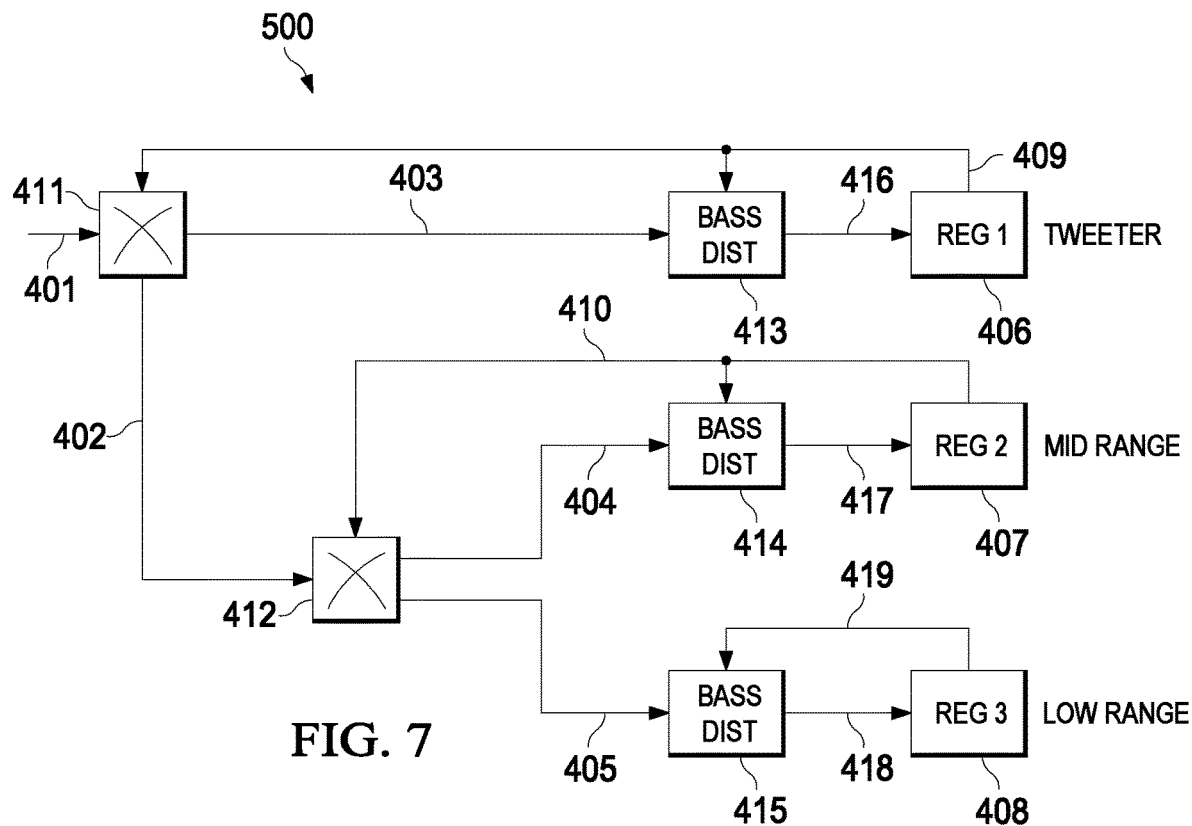
FIG. 7 is a block diagram of a system configured to perform audio enhancement (including bass enhancement) and compression (on a per speaker class basis) in accordance with an embodiment of the invention.

Elements of system 500 of FIG. 7 that are identical to corresponding elements of system 400 (of FIG. 6) are numbered identically in FIGS. 6 and 7.

Each of elements 413, 414, and 415 of system 500 of FIG. 7 is configured to perform bass volume enhancement of the type implemented by subsystem 201 of FIG. 4, and/or virtual bass enhancement of the type implemented by element 219 (or 220) of FIG. 5.

System 500 of FIG. 7 implements a combination of bass distribution (and/or virtual bass enhancement) on a per regulator basis, and routes audio content to each class of speakers in accordance with the speaker characteristics of each class, across a system that has multiple regulators (406, 407, and 408). Each of the regulators is for a different speaker class.

Element 413 of FIG. 7 is configured to implement bass distribution of the type performed by subsystem 201 of FIG. 4; and/or virtual bass enhancement of the type performed by one or both of elements 219 and 220 of FIG. 5. For example:

element 413 (together with limiter 406) may implement the system of FIG. 5 (or a variation thereon), with limiter 406 corresponding to limiter 202 of FIG. 5, and with enhancement implemented by element 413 in response to compression feedback 409 from limiter 406. Preferably, element 413 implements smoothing of the type described above (e.g., smoothing of feedback signal 409);

element 414 (together with limiter 407) may also implement the system of FIG. 5 (or a variation thereon), with limiter 407 corresponding to limiter 202 of FIG. 5, and with enhancement implemented by element 414 in response to compression feedback 410 from limiter 407. Preferably, element 414 implements smoothing of the type described above (e.g., smoothing of feedback signal 410); and element 415 (together with limiter 408) may also implement the system of FIG. 5 (or a variation thereon), with limiter 408 corresponding to limiter 202 of FIG. 5, and with enhancement implemented by element 415 in response to compression feedback 419 from limiter 408. Preferably, element 415 implements smoothing of the type described above (e.g., smoothing of feedback signal 419).

The enhanced output 416 of element 413 may include bass distributed tweeter channels consisting of high frequency components 403 of the output of element 411 with virtual bass applied thereto. The enhanced output 416 is provided to limiter 406. The enhanced output 417 of element 414 may include bass distributed midrange channels consisting of high frequency components 404 of the output of element 412 with virtual bass applied thereto. The enhanced output 417 is provided to limiter 407. The enhanced output 418 of element 415 may include bass distributed low range channels consisting of low frequency components 405 of the output of element 412 with virtual bass applied thereto. The enhanced output 418 is provided to limiter 408.

Figure 8:
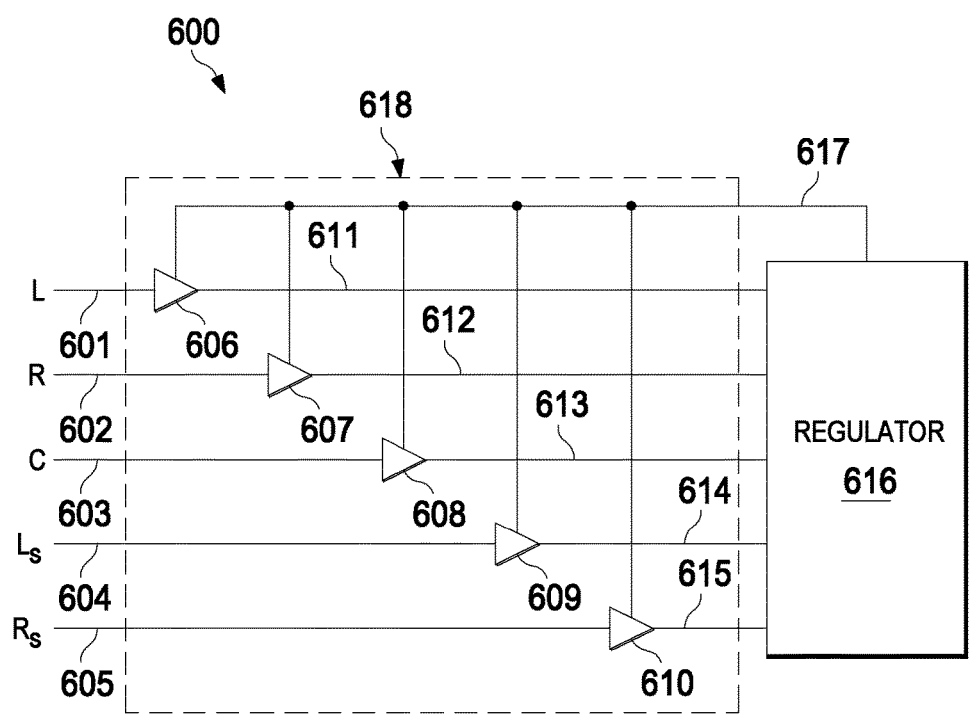
FIG. 8 is a block diagram of a system configured to perform dialog enhancement and compression in accordance with an embodiment of the invention.

With reference to FIG. 8, we next describe a class of embodiments of the inventive system which implement multichannel dialog enhancement in response to compression feedback. System 600 of FIG. 8 is an example of such a system. Embodiments in this class implement channel-based dialog enhancement to increase dialog intelligibility, typically by ducking non-center channels of a multichannel audio input when the compression feedback indicates that the regulator gains are limiting in the dialog bands. Optionally also, frequency dialog enhancement is performed on the center channel of the multichannel audio input in response to the compression feedback. In variations on the embodiment shown in FIG. 8, all or some of the input channels are object channels (audio objects), the non-dialog objects are ducked, and dialog-enhancing gain can be applied to the dialog objects (dialog objects can either be extracted from normal objects, or they can be labeled as dialog objects within a bitstream).

The frequency bands in which dialog (human utterances) typically occurs, where intelligibility of the dialog will typically be significantly increased if content in such bands is enhanced, will be referred to herein as dialog bands.

In system 600 of FIG. 8, the multichannel audio input signal includes left channel 601, right channel 602, center channel 603, left surround channel 604, and right surround channel 605. Gain element 606 is coupled and configured to apply a negative gain (which may be frequency dependent) to channel 601 in response to compression feedback 617 from multiband limiter 616 (when the feedback 617 indicates that gains applied by limiter 616 in the dialog bands are limiting). Gain element 607 is coupled and configured to apply a negative gain (which may be frequency dependent) to channel 602 in response to compression feedback 617 from multiband limiter 616 (when the feedback 617 indicates that gains applied by limiter 616 in the dialog bands are limiting). Gain element 609 is coupled and configured to apply a negative gain (which may be frequency dependent) to channel 604 in response to compression feedback 617 from multiband limiter 616 (when the feedback 617 indicates that gains applied by limiter 616 in the dialog bands are limiting). Gain element 610 is coupled and configured to apply a negative gain (which may be frequency dependent) to channel 605 in response to compression feedback 617 from multiband limiter 616 (when the feedback 617 indicates that gains applied by limiter 616 in the dialog bands are limiting).

In a typical implementation, gain element 608 is coupled and configured to apply to center channel 603 a dialog-enhancing gain (which may be frequency dependent, in the sense that it may consist of different gains applied in different frequency bands of center channel 603) in response to compression feedback 617 from multiband limiter 616. For example, element 608 may apply unity gain (so that channel 613 is identical to channel 603) when feedback 617 indicates that that gains applied by limiter 616 in the dialog bands are not limiting (or not significantly limiting), and element 608 may apply frequency-dependent gain to channel 603 (e.g., to emphasize content in non-dialog bands relative to content in dialog bands) in response to feedback 617 indicating that that gain applied by limiter 616 in at least one of the dialog bands is limiting.

In alternative implementations, gain element 608 is omitted (or always applies unity gain), so that channel 613 is always identical to channel 603.

The output of element 606 is ducked channel 611. It is identical to channel 601 when feedback 617 indicates that that gains applied by limiter 616 in the dialog bands are not limiting (or not significantly limiting). The output of element 607 is ducked channel 612. It is identical to channel 602 when feedback 617 indicates that that gains applied by limiter 616 in the dialog bands are not limiting (or not significantly limiting). The output of element 609 is ducked channel 614. It is identical to channel 604 in response to feedback 617 indicating that that gains applied by limiter 616 in the dialog bands are not limiting (or not significantly limiting). The output of element 610 is ducked channel 615. It is identical to channel 605 in response to feedback 617 indicating that that gains applied by limiter 616 in the dialog bands are not limiting (or not significantly limiting).

The output of element 608 is dialog enhanced channel 613. Channel 613 is typically identical to channel 603 when feedback 617 indicates that that gains applied by limiter 616 in the dialog bands are not limiting (or not significantly limiting). In response to feedback 617 indicating that that gains applied by limiter 616 in the dialog bands are limiting, element 608 may apply a dialog-enhancing gain (which may be frequency-dependent gain) to channel 603 to generate channel 613. In this latter case, the dialog-enhancing gain applied by element 608 may boost dialog bands of channel 603 differently than other bands of channel 603. A downmixer (not shown in FIG. 8) may exist between the outputs of dialog enhancer subsystem (subsystem 618 in FIG. 8) and the inputs of the multiband limiter (multiband limiter 616 in FIG. 8).

Compression feedback 617 from multiband limiter 616 may be indicative of gains applied in all bands of all or some of channels 611, 612, 613, 614, and 615 (e.g., only channel 613). Alternatively, compression feedback 617 may be indicative of gains applied only in dialog bands of all or some of channels 611, 612, 613, 614, and 615 (e.g., only channel 613).

In some implementations, feedback 617 can be replaced by (or include) feedback other than compression feedback (e.g., it may be feedback from a smart amplifier). In some implementations the feedback may be indicative of state of a system volume control, as is the feedback in some above-noted implementations of FIG. 6. Such volume control feedback may be useful since it may indicate that a user is informing the signal chain that he or she cannot understand the dialog emitted from the speaker(s) (in the same or similar way that compression feedback indicative of gains applied by limiter 616 may indicate, by allowing an inference, that a user cannot understand the dialog), causing the system's dialog enhancement processing to change accordingly.

Subsystem 618 of system 600 of FIG. 8 (which includes elements 606, 607, 608, 609, and 610) is a ducking based dialog enhancer subsystem.

In some variations on the FIG. 8 system, multiband limiter 616 is replaced by two or more multiband limiters (e.g., one for each different class of speakers, as are, for example, limiters 406, 407, and 408 of FIG. 7). One of these limiters (to be referred to as the center channel limiter) is coupled and configured to apply compression to center channel 613. In such variations, subsystem 618 may be implemented in any of the ways described above with reference to FIG. 8, except that the feedback for each channel (i.e., the feedback applied to each of elements 606, 607, 608, 609, and 610) is generated in the center channel limiter (i.e., it is compression feedback indicative of an amount of limiting by the center channel limiter). In some such variations, multiple limiters are used even though all speakers belong to the same class, to ensure that the center channel is always intelligible.

Figure 9:
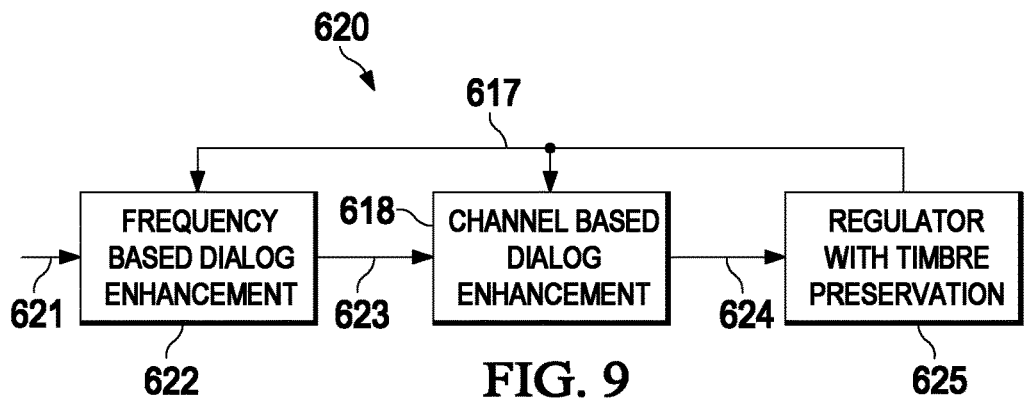
FIG. 9 is a block diagram of a system configured to perform frequency based dialog enhancement, channel based dialog enhancement, and compression in accordance with an embodiment of the invention.

In order to provide the user a more compelling experience, some embodiments of the inventive system implement a combination of channel based dialog enhancement (e.g., as described with reference to FIG. 8), frequency dependent dialog enhancement, and broadband limiting (i.e., timbre preservation). FIG. 9 is a block diagram of a system (system 620) which implements a combination of those three algorithmic components.

In system 620 of FIG. 9:

multichannel audio input signal 621 is provided to stage 622. Signal 621 may be a 5.1 channel input audio signal, or another multichannel signal (typically having more than two channels) from which clean dialog can be extracted;

stage 622 is a frequency based dialog enhancement subsystem, configured to apply a filter that emphasizes frequencies in the dialog bands, in response to compression feedback 617 from multiband limiter 625 (or other feedback, e.g., of any of the types described above), to generate output signal 623. The filter may perform filtering on clean dialog or dialog mixed into the channels of signal 621. Typically, any adjustment on the amount of dialog enhancement implemented by the filter is smoothed. If multiband limiter 625 is limiting in the dialog bands (as indicated by compression feedback), then the dialog bands are emphasized by subsystem 622, so that signal 623 is a set of channels indicative of dialog which has been enhanced by frequency based dialog enhancement subsystem 622;

stage 618 is a ducking based dialog enhancer subsystem (e.g., one identical to subsystem 618 of FIG. 8) which applies channel based dialog enhancement processing in response to compression feedback 617 from multiband limiter 625 (or other feedback, e.g., of any of the types described above), to generate output signal 624 in response to signal 623. Subsystem 618 implements channel based dialog enhancement (i.e. ducking of non-center (e.g., surround) channels with possible boosting of the center channel); and stage 625 is a multiband limiter which is configured specifically to implement timbre preservation in the dialog bands (and bands adjacent thereto), and which generates an output signal (for playback or rendering and playback) in response to signal 624. Limiter 625 implements wider band limiting in particular bands (i.e., the dialog bands and the bands adjacent thereto) to preserve timbre of audio content. When limiter 625 limits within the dialog bands, the adjacent bands are also turned down (limited), and feedback 617 is generated so as to cause the frequency dependent dialog enhancement (performed by subsystem 622) to be increased (turned up), thereby increasing the intelligibility of dialog within the limits of the speaker system.

In variations on system 620 of FIG. 9, the order of frequency dependent dialog enhancement subsystem 622 and channel based dialog enhancement subsystem 618 is reversed, so that the channel based dialog enhancement subsystem (e.g., which performs the functions of subsystem 618) operates on input signal 621, the frequency dependent dialog enhancement subsystem (e.g., which performs the functions of subsystem 622) operates on the output of subsystem 618, and limiter 625 operates on the output of the frequency dependent dialog enhancement subsystem.

Figure 10:
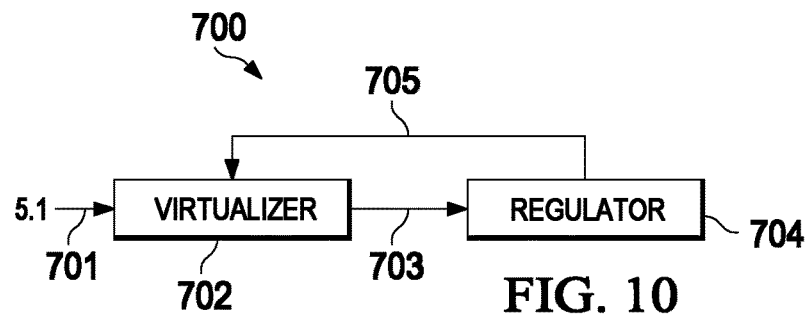
FIG. 10 is a block diagram of a system configured to perform virtualization and compression in accordance with an embodiment of the invention

With reference to FIG. 10, we next describe a class of embodiments of the inventive system which implement devirtualization in response to compression feedback, to control (e.g., lower) an amount of virtualization which would otherwise be applied. In some such embodiments, the compression feedback is indicative of state of a system volume control (in some cases, implementing such embodiments may require special tuning by field engineers).

Some virtualizers result in a volume and/or intelligibility reduction when virtualizing.

By reducing the virtualization when a multiband limiter is actively limiting, the loudness and intelligibility of an audio program (e.g., a movie soundtrack) can be improved, possibly at the cost of spatial fidelity.

Thus, some embodiments of the invention use a virtualizer start band as a control mechanism (responsive to compression feedback or other feedback) for the amount of virtualization that occurs. On low frequency bands (below the start band), virtualization is not applied. On high frequency bands (above the start band) virtualization is applied. Preferably, changes of the virtualizer start band (in response to the compression feedback or other feedback) are heavily smoothed to ensure that the user does not experience spatial collapse. Alternatively, the amount of virtualization performed individual frequency bands is controlled in response to compression feedback (or other feedback), e.g., from a multiband limiter.

In some alternative implementations, rather than (or in addition to) adjusting the start frequency for virtualization in response to feedback, the speaker angle of a virtualizer is controlled in response to compression feedback from a multiband limiter (or other feedback), to provide a reduction in the virtualization effect as the angle approaches zero.

In the system (virtualizer 700) of FIG. 10:

virtualizer stage 702 is configured to receive multichannel audio input signal 701 provided thereto. Signal 701 may be a 5.1 channel input audio signal, or another multichannel signal (typically having more than two channels);

virtualizer stage (subsystem) 702 is configured to implement an adjustment control which adjusts the amount (or another characteristic) of virtualization implemented by subsystem 702 in one or more bands (at least in one or more low bands) in response to feedback (e.g., compression feedback 705 from multiband limiter 704 indicative of whether the band(s) are being limited). Typically, if limiter 704 is limiting in the lowest "n" bands then virtualization will not be performed on those "n" bands. Preferably, subsystem 702 implements a long smoother (to smooth changes in amount(s) or other characteristic(s) of virtualization in response to feedback), to reduce perceptibility of any spatial collapse that results from changes in the virtualization in response to the feedback. In an alternative implementation, subsystem 702 adjusts the angle of the virtualizer in response to compression feedback 705 from multiband limiter 704 (preferably with smoothing), thus implementing a broadband gradual reduction of the virtualization in response to more limiting by limiter 704. The virtualization implemented by subsystem 702 can either be a frequency magnitude based virtualization only (e.g., as in a height filter) or a more complicated virtualization (e.g., a speaker virtualizer as implemented within the Dolby Audio API);

multiband limiter 704 is coupled and configured to perform limiting on the output signal 703 of virtualizer subsystem 702, and to generate (and provide to subsystem 702) compression feedback 705. As noted, in some embodiments subsystem 702 is configured to perform virtualization in response to feedback other than compression feedback from limiter 704, and in such embodiments limiter 704 need not generate compression feedback; and virtualized signal 703 (e.g., a stereo signal, when signal 701 is a 5.1 channel audio signal) is generated in subsystem 702 and provided to multiband limiter 704. In some implementations in which signal 703 includes more than two channels, subsystem 702 may change the routing of virtualized audio content between channels of signal 703 in response to compression feedback 705 (e.g., as audio content is routed between channels as described above with reference to the FIG. 4 embodiment) thus creating a different virtualized experience.

We next describe other embodiments of the inventive system which perform audio processing in response to compression feedback from a multiband limiter (or in response to other feedback).

In some such embodiments, object-based audio rendering is performed in response to compression feedback. Conventional rendering of object-based audio has generally ignored the speaker characteristics of the speaker system which is to implement playback. In accordance with some embodiments of the invention, object-based audio rendering (e.g., a type or characteristic thereof) is changed in response to compression feedback from a multiband limiter.

For example, with reference to FIG. 3A, signal 801 of FIG. 3A may include channels (object channels) indicative of audio objects. In cases in which they do, rendering subsystem 803 may be an object-based audio rendering system configured to prioritize audio objects (indicated by signal 801 and the decoded version of signal 801 provided to subsystem 803) based upon a priority field of each object (also indicated by signal 801, or metadata corresponding to each audio object of signal 801) such that when multiband limiter (regulator) 806 limits audio content of at least one audio object (as indicated by feedback 807 provided by (e.g., generated and provided by) limiter 806 to subsystem 803), or when feedback 809 indicates that low priority objects should not be rendered, low priority objects are not rendered by subsystem 803 whereas high priority objects are rendered normally by subsystem 803. In such implementations of FIG. 3A, feedback 807 may also be provided from limiter 806 (and/or feedback 809 may be provided from amplifier 808) to subsystem 805 to control operation of subsystem 805 (e.g., as in any embodiment of 805, or subsystem 102 of FIG. 3, described herein), but in some cases feedback 807 is not provided from limiter 806 to subsystem 805.

Another example of a feedback mechanism (in which feedback 807 and/or 809 of FIG. 3A is provided to rendering subsystem 803 to control operation of subsystem 803) is performed in any of the following cases: signal 801 includes two sets of object streams (object channels); or signal 801 includes one set of speaker channels and one set of object streams; or signal 801 includes two sets of speaker channels. In this example, rendering by subsystem 803 includes mixing of content of such channels (speaker and/or object channels) in response to feedback 807 and/or 809 (e.g., with a priority of each individual channel that is or may be mixed determined by feedback 807 and/or 809, e.g., so that the channels have different relative priorities when regulator 806 is limiting than when it is not limiting). This is preferably implemented to ensure that the user will always be able to hear the most important parts of the content.

The type of rendering by subsystem 803 may change in response to feedback 807 and/or 809 (and/or in response to other feedback, e.g., compression feedback, provided to subsystem 803). For example, consider a feature of object-based audio rendering (OAR) known as "channel distribution" (which is different than bass distribution). Channel distribution spreads content of speaker channels (being rendered with object channels) to nearby speakers according to a gain curve. In some embodiments of the inventive system, channel distribution in OAR (e.g., implemented by subsystem 803 of FIG. 3A) is controlled (e.g., turned on or modified) for all speaker channels when regulator 806 starts limiting (as indicated by feedback 807), e.g., to spread the energy of the channels to more speakers. For example, subsystem 803 may change a gradient of the gain curve of the channel distribution in response to feedback 807 and/or 809, so that the gain curve becomes shallower, thus increasing the amount of energy pumped (as a result of rendering by subsystem 803) into at least some of the speakers of a speaker system (e.g., speaker system 109) as regulator 806 limits.

Figure 11:
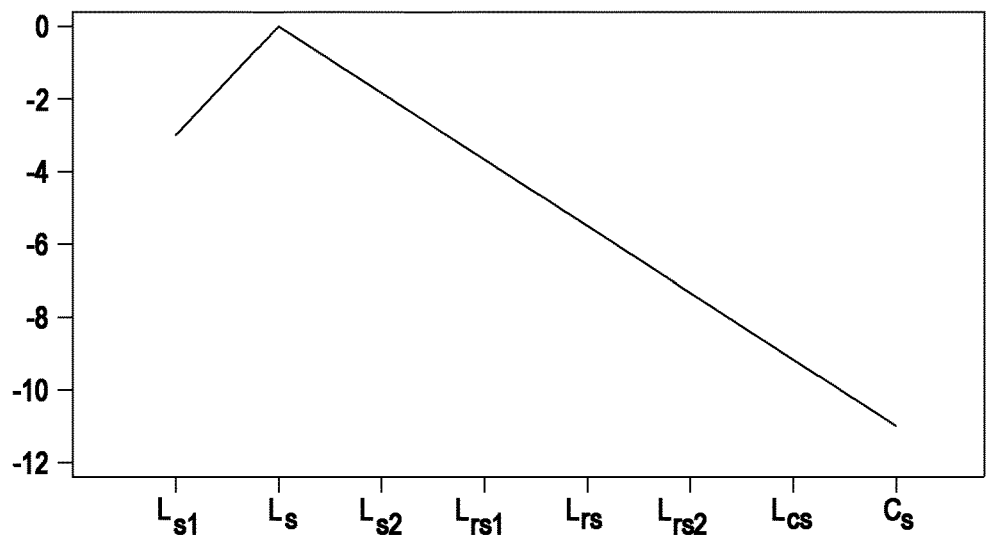
FIG. 11 is a gain curve for channel distribution of content of a channel (channel "Ls") of a multichannel audio signal. The horizontal axis indicates each of the channels to which the content is distributed, and the vertical axis indicates gain applied to the content distributed to each of the channels.

With reference to FIG. 11, an example of such channel distribution will be described. FIG. 11 assumes that the signal (e.g., the decoded signal output from subsystem 802 of FIG. 3A) is to be rendered (e.g., by subsystem 803 for playback by a speaker system) to at least eight speaker channels (channels Ls1, Ls, Ls2, Lrs1, Lrs, Lrs2, Lcs, and Cs), each corresponding to a different speaker of the speaker system (e.g., speaker system 109). The content to undergo channel distribution may be indicated by one speaker channel (channel "Ls," in FIG. 11) or one object channel, and the channel distribution may be implemented by copying the content to the other channels with an adjustable gain curve (e.g., the gain curve shown in FIG. 11, or an adjusted version of that gain curve which has been adjusted in response to feedback). FIG. 11 is a gain curve for channel distribution of content (e.g., PCM content) of channel Ls, with the vertical axis indicating gains, each of the gains indicating a degree of distribution of each channel applied by the rendering system (e.g., subsystem 803 of FIG. 3A, or subsystem 108 of FIG. 3). For example, FIG. 11 indicates that content of channel Ls is rendered to channel Ls with full gain ("0" gain, as indicated by the vertical axis), that content of channel Ls is distributed to channel Ls2 with a degree of distribution (indicated by the gain "−2" on the vertical axis), and that content of channel Ls is distributed to channel Lrs1 with a lesser degree of distribution (approximately that indicated by the gain "−4" on the vertical axis).

In response to the feedback (feedback 807 and/or 809), subsystem 803 may change the degree of channel distribution of content of channel Ls. This may change each gradient of the FIG. 11 gain curve, e.g., by decreasing (making more negative) the slope of each segment of the gain curve, thereby reducing the amount of distribution of content of channel Ls to other speaker channels.

Examples of other changes in rendering (e.g., by subsystem 803 of FIG. 3A or subsystem 108 of FIG. 3) which may be implemented in accordance with some embodiments of the invention in response to feedback (e.g., feedback 807 and/or feedback 809, or feedback 105) include the following:

low priority object channels may be dropped (i.e.; not rendered) in response to the feedback;

the rendered size of at least one object, indicated by an object channel (e.g., an object channel of the output of subsystem 802 of FIG. 3A), may change in response to compression feedback from a multiband limiter (e.g., limiter 806) or feedback from a smart amplifier (e.g., amplifier 808). For example, if the limiter starts to limit, the rendered size of an object could increase thus spreading the object energy to more speakers; and/or a method of bass extraction of at least one object, indicated by an object channel (e.g., an object channel of the output of subsystem 802), may change in response to compression feedback from a multiband limiter (e.g., limiter 806) or feedback from a smart amplifier (e.g., amplifier 808). For example, object bass extraction of two (or more) object channels may be controlled by the feedback in the same way that bass extraction is controlled in the above-described FIG. 4 embodiment (e.g., bass content is extracted from a set of object channels and downmixed to mono, and then mixed back in to all or some of the channel outputs of the renderer), thus improving the power handling characteristics of the speakers employed for playback (e.g., speakers of subsystem 109); and/or the snapping of objects to speakers may change (e.g., its range may be changed) in response to compression feedback from a multiband limiter (e.g., limiter 806) or feedback from a smart amplifier (e.g., amplifier 808). If it starts to limit, the snapping of objects to speakers is preferably gradually decreased to spread the audio to more speakers; and/or the zone masking functionality may change (e.g., its range may be changed) in response to compression feedback from a multiband limiter (e.g., limiter 806) or feedback from a smart amplifier (e.g., amplifier 808), e.g., such that fewer zones are masked by the renderer when a global regulator (e.g., limiter 806) is limiting; and/or the amount of trim that is applied by an object renderer to each object may change in response to compression feedback from a multiband limiter (e.g., limiter 806) or feedback from a smart amplifier (e.g., amplifier 808). For example, it could be decreased as the amount of limiting increases. This would give the effect of an increase in volume as the signal level increases at the cost of spatial balance (since the back of the room would have more energy).

In some embodiments, dynamic range compression (DRC) gains and curves that are applied to an audio signal (e.g., by Dolby Digital Plus and AC4 codecs) are controlled in response to compression feedback from a multiband limiter (e.g., limiter 104 of FIG. 3 or limiter 806 of FIG. 3A) or feedback from a smart amplifier (e.g., feedback 809 from amplifier 808). For example, when system 800 (or decoder subsystem 802 and/or rendering subsystem 803) of FIG. 3A is implemented in or as a decoder (e.g., a codec), subsystem 802 (and/or subsystem 803) may operate in response to compression feedback 807 and/or feedback 809 to selectively apply DRC or to apply DRC more or less aggressively. Additionally, single ended DRC curves (e.g., those built into a post-processing library) may be applied (e.g., by decoder subsystem 802 and/or rendering subsystem 803) more or less aggressively in response to compression feedback from a multiband limiter (or feedback from a smart amplifier).

Some codecs (e.g., Dolby Digital Plus and AC4 codecs) and other decoders have end-point specific features, for example, speaker virtualization, headphone virtualization, and object audio versus speaker channel audio. In some embodiments, at least one such feature (e.g., virtualization) is controlled (e.g., within a decoder) in response to compression feedback from a multiband limiter (e.g., limiter 104). For example, when system 800 of FIG. 3A (or subsystem 100 of FIG. 3) is implemented in or as a decoder (e.g., codec), subsystem 102 (or subsystem 802 or 803 of FIG. 3A) may operate in response to compression feedback (feedback 807 or 105) or other feedback (e.g., feedback 809 from smart amplifier 808) to perform speaker virtualization, headphone virtualization, and/or other audio enhancement (and/or other processing) of object channels and/or speaker channels.

In another example, a decoder (e.g., system 800 or subsystem 802 of FIG. 3A) has both an object output mode and a speaker channel output mode (e.g., as does a Dolby Digital Plus decoder in the case of Joint Object Coding bitstreams), or is otherwise configured to selectively decode or ignore individual object and/or speaker channels. If a multiband limiter is limiting, such a decoder (or a device including such a decoder) may (in response to compression feedback from the limiter) choose to operate in the speaker channel output mode of the decoder (or otherwise to ignore all or some object channels, and instead to decode only speaker channels) to save computational complexity (e.g., when the decoder is an element of a mobile phone or other device having limited computational capabilities). Or, in response to compression feedback (e.g., feedback 807) and/or feedback from a smart amplifier (e.g., feedback 809), such a decoder (or a device including such a decoder) may ignore all or some object channels and instead decode only speaker channels (or otherwise perform decoding in a manner determined at least in part by the compression feedback and/or feedback from a smart amplifier).

Embodiments of the invention (e.g., those specifically described herein) can be combined to give superior performance and are not typically mutually exclusive. In some such cases, smoothing (e.g., of compression feedback from a multiband limiter, or multiband limiter gain inputs) should be adjusted depending on the embodiments implemented.

In some embodiments, the invention is a system or device (e.g., a playback device or other device having physically-limited or otherwise limited bass reproduction capabilities, such as, for example, a notebook computer, laptop computer, tablet, soundbar, mobile phone, or other device with at least one small speaker) configured to perform any embodiment of the inventive method on an input audio signal. For example, the FIG. 3 system (or subsystem 100 and/or subsystem 108 thereof) or the FIG. 3A system (or one or more subsystems thereof) may be (or be included in): a playback device which includes all the elements of the FIG. 3 system (or of subsystem 100 and/or subsystem 108 thereof) or the FIG. 3A system (or one or more subsystems thereof), so that the device implements all such elements; or an audio processor which includes (in the sense that it implements) all of the elements of the FIG. 3 system (or subsystem 100 and/or subsystem 108 thereof) or the FIG. 3A system (or one or more subsystems thereof).

In a class of embodiments, the invention is an audio playback system (e.g., the FIG. 3 system (or subsystem 100 and/or subsystem 108 thereof)) or the FIG. 3A system (or one or more subsystems thereof) implemented as a notebook, tablet, laptop, soundbar, mobile phone, or other device with small speakers, or a playback system which has limited (e.g., physically-limited) bass reproduction capabilities), and is configured to perform audio enhancement (e.g., bass enhancement) and/or rendering and/or decoding on audio in response to compression feedback (in accordance with any embodiment of the inventive method) and/or feedback from a smart amplifier, to generate enhanced audio (e.g., enhanced, compressed audio), and to render and play the enhanced audio.

In typical embodiments, the inventive system is or includes a general or special purpose processor (e.g., an implementation of subsystem 100 and/or subsystem 108 of FIG. 3, or of the FIG. 3A system or one or more subsystems thereof) programmed with software (or firmware) and/or otherwise configured to perform an embodiment of the inventive method. In some embodiments, the inventive system is a general purpose processor, coupled to receive input audio data, and programmed (with appropriate software) to generate output audio data in response to the input audio data by performing an embodiment of the inventive method. In some embodiments, the inventive system is a digital signal processor (e.g., an implementation subsystem 100 and/or subsystem 108 of FIG. 3 or the FIG. 3A system or one or more subsystems thereof), coupled to receive input audio data, and configured (e.g., programmed) to generate output audio data in response to the input audio data by performing an embodiment of the inventive method.

In some embodiments, the invention is a computer program product, the computer program product being tangibly stored on a non-transient computer-readable medium and comprising machine executable instructions which, when executed, cause the machine to perform any embodiment of the inventive method or steps thereof.

While specific embodiments of the present invention and applications of the invention have been described herein, it will be apparent to those of ordinary skill in the art that many variations on the embodiments and applications described herein are possible without departing from the scope of the invention described and claimed herein. It should be understood that while certain forms of the invention have been shown and described, the invention is not to be limited to the specific embodiments described and shown or the specific methods described.

What is claimed is:

1. A method for audio signal compression and enhancement, including: performing enhancement on a multichannel audio signal to generate an enhanced multichannel audio signal; and performing multiband compression on the enhanced multichannel audio signal using a multiband limiter, thereby generating a compressed, enhanced multichannel audio signal, wherein the enhancement is performed in response to feedback from the multiband limiter, and wherein the enhancement comprises extracting a low frequency audio signal and a high frequency audio signal from each channel of the multichannel audio signal, summing together the extracted low frequency audio signals to generate a summed signal, and mixing the summed signal back into each extracted high frequency audio signal to generate the enhanced multichannel audio signal.

2. The method of claim 1, wherein the compression is applied by two or more multiband limiters, each coupled and configured to generate compressed, enhanced audio for playback by a different subset of a set of speakers, and the enhancement includes dynamic routing of audio content of the multichannel audio signal between channels of the enhanced audio signal to be compressed by different ones of the limiters.

3. The method of claim 1, wherein the enhancement is performed in response to the compression feedback, and the compression feedback is indicative of amount of compression applied to each of at least two frequency bands of the enhanced audio signal.

4. The method of claim 1, wherein the enhancement is performed in response to the compression feedback, and the compression feedback is indicative of at least one of amount or type of distortion predicted for a least one driver or to be prevented by the step of performing multiband compression.

5. The method of claim 1, wherein the enhancement includes at least one of bass volume enhancement, virtual bass enhancement, dialog enhancement, or virtualization.

6. The method of claim 1, wherein the multiband compression is performed on the enhanced multichannel audio signal, in a manner intended to prevent distortion upon playback of the compressed, enhanced multichannel audio signal.

7. A computer program product, the computer program product being tangibly stored on a non-transient computer-readable medium and comprising machine executable instructions which, when executed, cause a machine to perform steps of the method of claim 1.

\* \* \* \* \*